(12) United States Patent
Galton et al.

(10) Patent No.: US 7,999,622 B2
(45) Date of Patent: Aug. 16, 2011

(54) ADAPTIVE PHASE NOISE CANCELLATION FOR FRACTIONAL-N PHASE LOCKED LOOP

(75) Inventors: Ian Galton, Del Mar, CA (US); Ashok Swaminathan, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 133 days.

(21) Appl. No.: 12/352,293

(22) Filed: Jan. 12, 2009

(65) Prior Publication Data

US 2010/0039182 A1    Feb. 18, 2010

Related U.S. Application Data

(60) Provisional application No. 61/010,640, filed on Jan. 10, 2008.

(51) Int. Cl.
*H03L 7/00* (2006.01)

(52) U.S. Cl. ............ 331/16; 331/1 A; 331/1 R; 331/17; 331/34; 331/36 C; 331/177 R; 331/177 V; 375/376

(58) Field of Classification Search ............ 331/1 A, 331/1 R, 16, 17, 34, 36 C, 177 R, 177 V; 375/376
See application file for complete search history.

(56) References Cited

U.S. PATENT DOCUMENTS

| | | | | |
|---|---|---|---|---|
| 6,011,822 | A * | 1/2000 | Dreyer | 375/376 |
| 6,903,585 | B2 * | 6/2005 | Keaveney | 327/148 |
| 7,148,758 | B1 * | 12/2006 | Ross et al. | 331/17 |
| 7,439,783 | B2 * | 10/2008 | Weller et al. | 327/157 |
| 2004/0066244 | A1 * | 4/2004 | Takinami et al. | 331/117 R |
| 2005/0090218 | A1 * | 4/2005 | Ishida et al. | 455/255 |
| 2005/0185746 | A1 * | 8/2005 | Jung | 375/374 |
| 2008/0258949 | A1 | 10/2008 | Galton | |
| 2009/0039929 | A1 * | 2/2009 | Kossel | 327/157 |

OTHER PUBLICATIONS

J. Craninckx and M. Steyaert. "A Fully Integrated CMOS DCS-1800 Frequency Synthesizer," *IEEE Journal of Solid-State Circuits*, vol. 33, No. 12, Dec. 1998.

A. Fishov, E. Siragusa, J. Welz, E. Fogleman and I. Galton. "Segmented Mismatch Shaping D/A Conversion." *Proceedings of the IEEE International Symposium on Circuits and Systems*, vol. 4, pp. 679-682, May 2002.

(Continued)

*Primary Examiner* — Arnold Kinkead
*Assistant Examiner* — Richard Tan
(74) *Attorney, Agent, or Firm* — Greer, Burns & Crain Ltd.

(57) ABSTRACT

An embodiment of the invention is a circuit for adaptive phase noise cancellation for a fractional-N PLL. A preferred embodiment employs a split loop filter architecture. Two loop filter halves separately drive half-sized parallel varactors in a voltage controlled oscillator (VCO) and also drive a differential-input lowpass frequency selective circuit, e.g., a differential-input integrator in a least mean squared (LMS) feedback loop. The output of the differential-input lowpass frequency selective circuit controls the gain matching of a phase noise cancellation path to minimize phase noise arising from quantization error associated with the sequence of divider modulus values in the fractional-N PLL. The two varactor capacitances add together in the VCO tank, so the VCO frequency depends on the common-mode loop filter voltage and is relatively insensitive to differential-mode voltage. In contrast, the differential integrator operates on the differential-mode voltage from the two loop filter halves but attenuates their common-mode voltage.

13 Claims, 16 Drawing Sheets

OTHER PUBLICATIONS

M. Gupta and B-S Song. "A 1.8GHz Spur-Cancelled Fractional-N Frequency Synthesizer with LMS-Based DAC Gain Calibration," *Digest of the 2006 International Solid-State CircuitsConference*, Feb. 2006.

P. Larsson. "A 2-1600 MHz CMOS Clock Recovery PLL with Low-Vdd Capability," *IEEE Journal of Solid-State Circuits*, vol. 34, No. 12, Dec. 1999.

J. Lee, S-O Lee, M. Yoh, I. Ryu and B-H Park. "A 13mW 2GHz/520MHz Dual-Band Frequency Synthesizer for PCS Applications," *Journal of the Korean Physical Society*, vol. 39, No. 1, Jul. 2001.

S. T. Lee, S. J. Fang, D. J. Allstot, A. Bellaouar, A. R. Fridi, and P. A. Fontaine. "A Quad-Band GSM-GPRS Transmitter with Digital Auto-calibration," *IEEE Journal of Solid-State Circuits*, vol. 39, No. 12, Dec. 2004.

F. L. Martin. "A Wideband 1.3GHz PLL for Transmit Remodulation Suppression," IEEE *International Solid-State Circuits Conference*, vol. 44, Feb. 2001.

S. E. Meninger and M. H. Perrott. "A Dual Band 1.8GHz/900MHz 750kb/s GMSK Transmitter Utilizing a Hybrid PFD/DAC Structure for Reduced Broadband Phase Noise," *2005 Symposium on VLSI Circuits*, Jun. 2005.

S. Pamarti, L. Jansson and I. Galton. "A Wideband 2.4GHz Delta-Sigma Fractional-N PLL with 1Mb/s In-Loop Modulation," *IEEE Journal of Solid-State Circuits*, vol. 39, No. 1, Jan. 2004.

S. Pamarti and I. Galton. "Phase-Noise Cancellation Design Tradeoffs in Delta-Sigma Fractional-N PLLs," *IEEE Transactions on Circuits and Systems II : Analog and Digital Signal Processing*, vol. 50, No. 11, Nov. 2003.

M. H. Perrott, M. D. Trott and C. G. Sodini. "A Modeling Approach for SD Fractional-$N$ Frequency Synthesizers Allowing Straightforward Noise Analysis," *IEEE Journal of Solid-State Circuits*, vol. 37, No. 8, Aug. 2002.

K. Shu, E. Sanchez-Sincencio, J. Silva-Martinez and S. H. K. Embabi. "A 2.4-GHz Monolithic Fractional-N Frequency Synthesizer with Robust Phase-Switching Prescaler and Loop Capacitance Multiplier," *IEEE Journal of Solid-State Circuits*, vol. 38, No. 6, Jun. 2003.

A. Sripad and D. Snyder. "A Necessary and Sufficient Condition for Quantization Errors to be Uniform and White," *IEEE Transactions on Acoustics, Speech and Signal Processing*, vol. 25, No. 5, Oct. 1977.

E. Temporiti, G. Albasini, I. Bietti, R. Castello and M. Colombo. "A 700-kHz bandwidth Sigma-Delta Fractional Synthesizer with Spurs Compensation and Linearization Techniques for WCDMA Applications," *IEEE Journal of Solid-State Circuits*, vol. 39, No. 9, Sep. 2004.

M. Zargari, M. Terrovitis, S-H Jen, B. J. Kaczynski, L. Meelan, M. P. Mack, S. S. Mehta, S. Mendis, K. Onodera, H. Samavati, W. W. Si, K. Singh, A. Tabatabaei, D. Weber, D. K. Su and B. A. Wooley. "A Single-Chip Dual-Band Tri-Mode CMOS Transceiver for IEEE 802.11a/b/g Wireless LAN," *IEEE Journal of Solid-State Circuits*, vol. 39, No. 12, Dec. 2004.

* cited by examiner

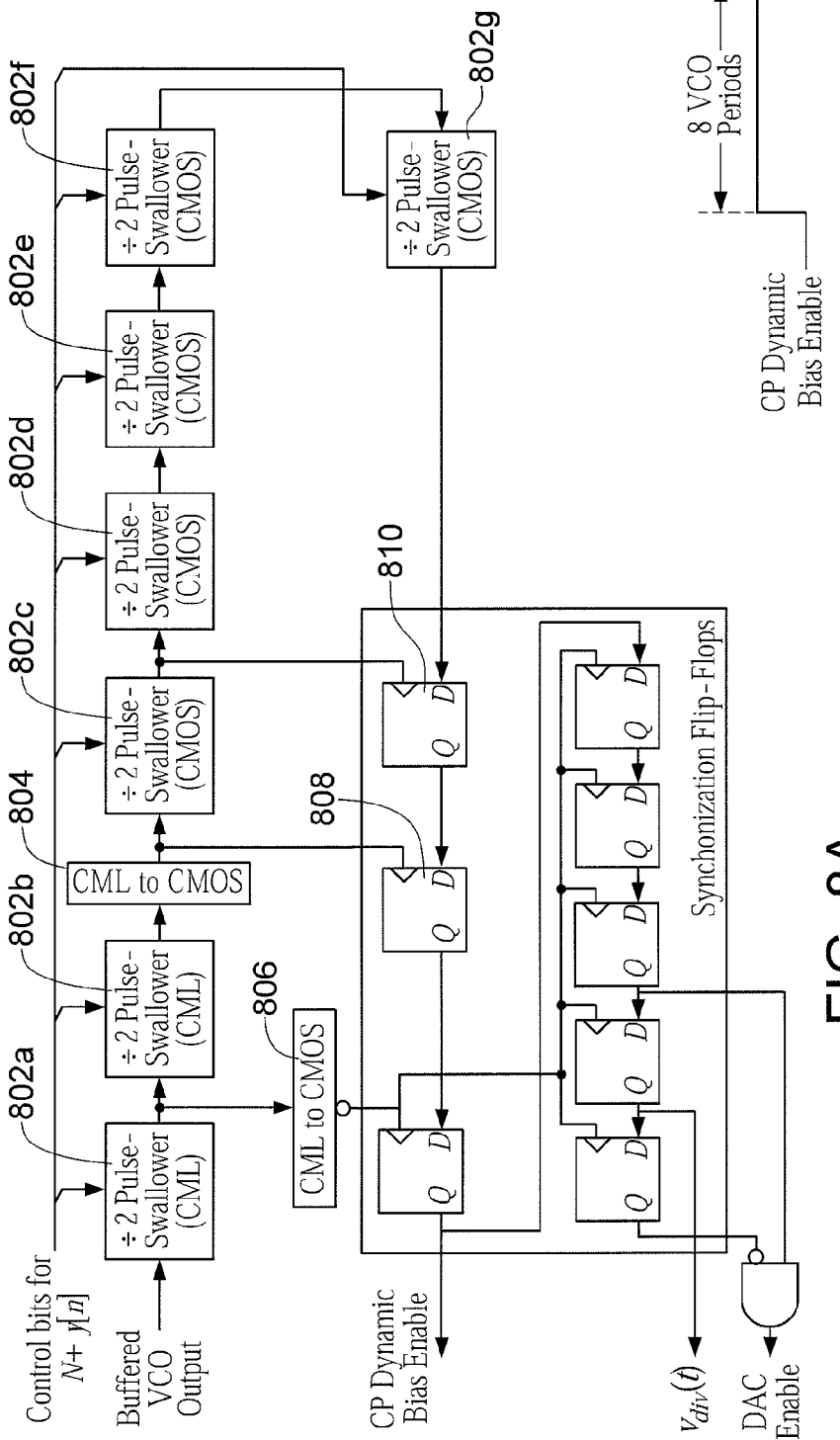
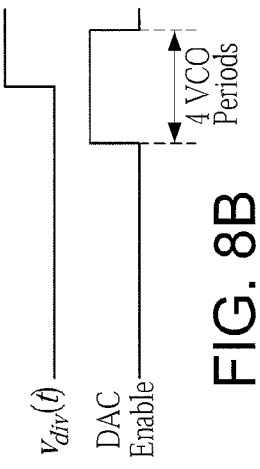
FIG. 8A
FIG. 8B

ADAPTIVE PHASE NOISE CANCELLATION FOR FRACTIONAL-N PHASE LOCKED LOOP

PRIORITY CLAIM AND REFERENCE TO RELATED APPLICATION

This application claims priority under 35 U.S.C. §119 from prior provisional application Ser. No. 61/010,640, filed Jan. 10, 2008.

STATEMENT OF GOVERNMENT INTEREST

This invention was made with government support under Award 0515286 awarded by National Science Foundation. The government has certain rights in the invention.

FIELD

A field of the invention is fractional-N phased locked loops (PLLs). An example application of the invention is to wireless communication circuits, such as GSM and Bluetooth circuits.

BACKGROUND

FIG. 1 is a block diagram of a conventional ΔΣ fractional-N PLL. The purpose of the system is to generate an output signal of frequency $(N+\alpha)f_{ref}$ where N is a positive integer, α is a constant fractional value between 0 and 1, and $f_{ref}$ is the frequency of a reference oscillator. The system consists of a phase-frequency detector (PFD) and a charge pump 100, a loop filter 102, a voltage controlled oscillator (VCO) 104, a multi-modulus divider 106, and a digital ΔΣ modulator 108. The divider output, $v_{div}(t)$, is a two-level signal in which the nth and (n+1)th rising edges are separated by N+y[n] periods of the VCO output, for n=1, 2, 3, ..., where y[n] is a sequence of integers generated by the ΔΣ modulator 108. As indicated in FIG. 1B for the case where the PLL, is locked, if the nth rising edge of the reference signal, $v_{ref}(t)$, occurs before that of $v_{div}(t)$, the charge pump 100 generates a positive current pulse of magnitude $I_{CP}$ with a duration equal to the time difference between the two edges. This increases the VCO control voltage, $v_{ctrl}(t)$, thereby increasing the VCO output frequency. Alternatively, if the nth rising edge of $v_{ref}(t)$, occurs after that of $v_{div}(t)$, the situation is similar except the polarity of the current pulse is negative, which decreases the VCO frequency.

If y[n] could be set directly to the desired fractional value, α, then the output frequency of the PLL would settle to $(N+\alpha)f_{ref}$. Unfortunately, y[n] is is restricted to integer values because the divider 106 is only able to count integer VCO cycles. To circumvent this limitation, the ΔΣ modulator 108 generates a sequence of integer values that average to α. The sequence can be written as $y[n]=a+e_{\Delta\Sigma}[n]$, where $e_{\Delta\Sigma}[n]$ is zero-mean quantization noise. Thus, the PLL output frequency settles to $(N+\alpha)f_{ref}$ as desired, although a price is paid in terms of added phase noise resulting from the quantization noise.

As shown in M. H. Perrott, M. D. Trott, C. G. Sodini, "A Modeling Approach for D-S Fractional-N Frequency Synthesizers Allowing Straightforward Noise Analysis," *IEEE Journal of Solid State Circuits*. Vol. 37, No. 8, pp. 1028-38, August 2002, in terms of its effect on the PLL phase noise, the quantization noise can be modeled as a sequence of additive charge samples, $Q_{cp\text{-}\Delta\Sigma}[n]$, that get injected into the loop filter once every reference period. Neglecting a constant offset associated with the initial conditions of the loop filter, it can be shown that $Q_{cp\text{-}\Delta\Sigma}[n]$ is given by $$Q_{cp\text{-}\Delta\Sigma}[n] = T_{VCO}I_{CP}\sum_{k=n_0}^{n-1} e_{\Delta\Sigma}[k], \quad (1)$$

where $T_{VCO}$ is the period of the VCO output (for a given value of α, $T_{VCO}$ is well-modeled as a constant) and $n_0<n$ is an arbitrary initial time index. The PLL has the effect of lowpass filtering $Q_{cp\text{-}\Delta\Sigma}[n]$ in the process of converting it to output phase noise.

The ΔΣ modulator 108 quantizes its input in such a way that $e_{\Delta\Sigma}[n]$ is spectrally shaped with most of its power concentrated at high frequencies. For example, in a properly dithered second-order ΔΣ modulator, $e_{\Delta\Sigma}[n]$ has a power spectral density (PSD) equal to that of discrete-time white noise with variance 1/12 passed through a high pass filter. In the example embodiment that uses a $2^{nd}$ order delta sigma modulator, the high pass filter has a transfer function $(1-z^{-1})^2$. It follows from (1) that this causes $Q_{cp\text{-}\Delta\Sigma}[n]$ to have a PSD equal to that of discrete-time white noise with variance $(T_{VCO}I_{CP})^2/12$ passed through a highpass filter with transfer function $1-z^{-1}$. Hence, the PSD of $Q_{cp\text{-}\Delta\Sigma}[n]$ has a zero at DC and rises at 6 dB per octave in frequency until nearly half the reference frequency. Provided the bandwidth of the PLL is very narrow, most of the power in $Q_{cp\text{-}\Delta\Sigma}[n]$ is suppressed by the PLL so it has only a small effect on the overall PLL phase noise. However, as the PLL bandwidth is increased, less of the power in $Q_{cp\text{-}\Delta\Sigma}[n]$ is suppressed by the PLL, so its contribution to the PLL phase noise becomes more dominant. Thus, there is a fundamental bandwidth versus phase noise tradeoff in conventional ΔΣ fractional-N PLLs.

Phase noise cancelling ΔΣ fractional-N PLLs attempt to circumvent this tradeoff by cancelling the quantization noise prior to the loop filter, thereby eliminating the need for narrow-band filtering by the PLL to suppress the quantization noise. FIG. 2 shows an example, wherein the idea is to add a phase noise cancellation path 200, 202 to a conventional ΔΣ fractional-N PLL. The phase noise cancellation path discrete-time integrates the ΔΣ quantization noise to obtain the digital sequence $$e_{cp}[n] = \sum_{k=n_0}^{n-1} e_{\Delta\Sigma}[n], \quad (2)$$

and converts $-e_{cp}[n]$ via the DAC 202 into a current pulse of duration $T_{DAC}$ and amplitude $-e_{cp}[n]T_{VCO}I_{CP}/T_{DAC}$. To the extent that this can be done accurately, it follows from (1) and (2) that the charge in each DAC pulse cancels the $Q_{cp\text{-}\Delta\Sigma}[n]$ portion of the charge in the corresponding charge pump pulse.

In practice, the gain of the DAC 202 is never perfectly matched to that of the signal path through the PFD and charge pump 100, so the cancellation of quantization noise is imperfect. Component mismatches and non-ideal circuit behavior cause both amplitude and transient mismatches between the signals generated by the DAC 202 and the charge pump 100. This can be modeled by considering the actual amount of charge in each DAC pulse to deviate from its ideal value of $-e_{cp}[n]T_{VCO}I_{CP}$ by a factor of $(1+\beta)$, where β is a small constant that represents the cancellation path mismatch. As shown in S. Pamarti, I. Galton, "Phase-noise Cancellation Design Tradeoffs in Delta-Sigma Fractional-N PLLs", *IEEE Transactions on Circuits and Systems II: Analog and Digital Signal Processing*, Vol. 50. No. 11, pp. 829-838, November 2003, the PSD of the component of the PLL phase noise resulting from imperfect cancellation of the quantization noise is given approximately by $$S_{\theta_{PLL}}(j2\pi f)|_{\Delta\Sigma \text{ only}} = \beta^2 \frac{\pi^2}{3f_{ref}} \left|2\sin\left(\frac{\pi f}{f_{ref}}\right)\right|^{2(L-1)} |A_\theta(j2\pi f)|^2 \text{rad}^2/\text{Hz} \quad (3)$$

where $A_0$ (s) is the lowpass transfer function of the PLL from the phase of the reference oscillator to the phase of the PLL output normalized to unity at s=0, and L is the order of the $\Delta\Sigma$ modulator.

In general, $A_0(j2\pi f)$, has a bandwidth much less than the reference frequency. Given that $\sin(x) \approx x$ when $|x| \ll 1$, it follows from (3) that the integrated phase noise associated with imperfect quantization noise cancellation is approximately proportional to $\beta^2/f_{ref}^{2L-1}$. This indicates how the matching accuracy required for a given level of phase noise cancellation depends on the reference frequency. For example, suppose two phase noise cancelling PLLs have equal bandwidths and $\Delta\Sigma$ modulator orders, but their reference frequencies and DAC gain mismatches are given by $f_{ref1}$ and $f_{ref2}$ and $\beta_1$ and $\beta_2$, respectively. To ensure that the portions of their integrated phase noise powers associated with imperfect quantization noise cancellation are equal, it follows that the relation $$\frac{\beta_1^2}{f_{ref1}^{2L-1}} = \frac{\beta_2^2}{f_{ref2}^{2L-1}} \quad (4)$$

must hold. In particular, if $f_{ref2}=f_{ref1}/2$, then $\beta_2=\beta_1/2^{L-1/2}$. Thus, phase noise cancellation becomes increasingly difficult as the reference frequency is decreased. For example, if the reference frequency of a $\Delta\Sigma$ fractional-N PLL is halved without changing the PLL bandwidth or the cancellation path matching accuracy, then the power of the output phase noise arising from imperfect cancellation increases by $6(L-\frac{1}{2})$ dB where L is the $\Delta\Sigma$ modulation order (usually L=2 or 3). The adaptive calibration method of the invention addresses this problem by adaptively adjusting the DAC gain in one of the preferred embodiments to is minimize $|\beta|$.

In addition to the gain mismatch problem described above, another type of mismatch between the charge pump and DAC occurs in practice. Specifically, the charge pump pulses have a fixed amplitude and variable widths, whereas the DAC pulses have a fixed width and variable amplitudes. Unfortunately, this discrepancy is dictated by circuit limitations; as of the time of the invention it has not been practical to generate the timing signals needed to implement width-modulated DAC pulses that have sufficient accuracy. The result of the discrepancy is illustrated in FIG. 3 for the ideal matching case of $\beta=0$. The component of $v_{ctrl}(t)$ corresponding to quantization noise indeed goes to zero between DAC and charge pump pulses, but the cancellation is imperfect during the DAC and charge pump pulses. Thus, even if $|\beta|$ is made negligibly small, the quantization noise cancellation is imperfect in practice. Fortunately, the resulting phase noise is typically very small provided $T_{DAC}$ is relatively small and the DAC pulses are timed so as to overlap the charge pump pulses as much as possible. Alternatively, a sampled loop filter configuration can be used to address the problem as described in S. E. Meninger and M. H. Perrott, "A 1 MHz Bandwidth 3.6 GHz 0.18 µm CMOS fractional-N Synthesizer Utilizing a Hybrid PFD/DAC Structure for Reduced Broadband Phase Noise," *IEEE Journal of Solid-State Circuits*, Vol. 41. No. 4, pp. 966-980, April 2006.

As described above, phase noise cancellation makes it possible to greatly widen the loop bandwidth of a delta-sigma fractional-N PLL without the massive increase in phase noise that would otherwise be caused by the delta-sigma quantization noise. This allows the loop filter to be integrated on-chip, reduces sensitivity to VCO pulling and noise, better attenuates in-band VCO noise, and makes direct digital frequency modulation practical in wireless applications such as GSM and Bluetooth. However, good phase noise cancellation requires good matching of the cancellation and signal paths, and the matching precision required for a given level of performance increases dramatically as the reference frequency is decreased.

Example PLLs with phase noise cancellation based on passive matching have required reference frequencies of 35 MHz, 48 MHz, and 50 MHz to achieve 15 dB, 20 dB, and 29 dB of phase noise cancellation, respectively. See, E. Temporiti, G. Albasini, I. Bietti, R. Castello, M. Colombom "A 700 kHz Bandwidth $\Sigma\Delta$ Fractional Synthesizer with Spurs Compensation and Linearization Techniques for WCDMA Applications," IEEE Journal of Solid-State Circuits, vol. 39, no. 9, pp. 1446-54 (September 2004); S. Pamarti, L. Jansson, 1. Galton, "A Wideband 2.4 GHz $\Delta\Sigma$ A Fractional-N PLL with 1 Mb/s In-loop Modulation," IEEE Journal of Solid-State Circuits, vol. 39, no. 1, pp. 49-62 (January 2004); S. E. Meninger, and M. H. Perrott; and "A 1 MHz Bandwidth 3.6 GHz 0.18 um CMOS Fractional-N Synthesizer Utilizing a Hybrid PFD/DAC Structure for Reduced Broadband Phase Noise," IEEE Journal of Solid-State Circuits, vol. 41, no. 4, pp. 966-980 (2006). The need for such high reference frequencies represents a major limitation of phase noise cancellation with passive matching in wireless applications.

Adaptive Calibration

In principle, the sign-error LMS algorithm can be used to adaptively adjust the DAC gain to minimize $|\beta|$. See, e.g., Ali H. Saved, *Fundamentals of Adaptive Filtering*, Wiley-Interscience, 2003. Whenever the DAC gain is not ideal, imperfect cancellation of the quantization noise causes the charge pump and DAC pulses to inject an undesired net charge of $\beta Q_{cp-\Delta\Sigma}[n] = \beta T_{VCO} I_{CP} e_{cp}[n]$ into the loop filter each reference period. Suppose that a copy of these current pulses were multiplied by the sign of $e_{cp}[n]$, i.e., by $$\text{sgn}\{e_{cp}[n]\} = \begin{cases} 1, & \text{if } e_{cp}[n] \geq 0, \\ -1, & \text{if } e_{cp}[n] < 0, \end{cases} \quad (5)$$

and then injected into an integrating lowpass filter (i.e., a lowpass filter with a pole at s=0). In general, $\text{sgn}\{e_{cp}[n]\}$ has zero mean and is uncorrelated with all the noise sources in the PLL other than the quantization noise. Moreover, $e_{cp}[n] \text{sgn}\{e_{cp}[n]\} = |e_{cp}[n]|$. Therefore, if $\beta>0$, the output of the integrating lowpass filter would ramp up over time, and if $\beta<0$, it would ramp down over time. If the output of the integrating lowpass filter were used to control the gain of the DAC in a stable negative feedback configuration, then the feedback loop would continuously adjust the DAC gain toward the ideal case of B=0.

In practice, however, creating sufficiently accurate copies of the DAC and charge pump pulses multiplied by $e_{cp}[n]$ is challenging. This problem is circumvented in M. Gupta and B. S. Song, "A 1.8 GHz Spur Cancelled Fractional-N Frequency Synthesizer with LMS Based DAC Gain Calibration," *IEEE Journal of Solid-State Circuits*, Vol. 41, No. 12, pp. 2842-851, December 2006 by simply multiplying a buffered copy of $v_{ctrl}(t)$ by $\text{sgn}\{e_{cp}[n]\}$ as depicted in FIG. 4A. It can be shown that the resulting system implements an approximate version of the sign-error LMS algorithm described above. Although the feedback loop can be made to work properly, a practical problem arises because of the DC component in $v_{ctrl}(t)$. The DC component is necessary because it sets the frequency of the VCO, and the range of values it can take on as a function of the desired output frequency tends to be large. The problem is that the DC component gets multiplied by $\text{sgn}\{e_{cp}[n]\}$ and then fed back through an integrator 402 to control the DAC gain. If the feedback loop bandwidth is not sufficiently small, the resulting modulation of the DAC gain severely degrades the phase noise performance of the PLL. Unfortunately, as demonstrated via simulation results shown in FIG. 4B, the PSD of $\text{sgn}\{e_{cp}[n]\}$ tends to have large spurious tones. See, S. Pamarti, L. Jansson, I. Galton, "A Wideband 2.4 GHz $\Delta\Sigma$ Fractional-N PLL with 1 Mb/s in-loop Modulation," *IEEE Journal of Solid-State Circuits*. Vol. 39, No. 1, pp. 49-62, January 2004 and K. Wang, A. Swaminathan, I. Galton, "Spurious tone suppression techniques applied to a wide-bandwidth 2.4 GHz Fractional-N PLL," IEEE Journal of Solid-State Circuits, vol. 43, no 12, December 2008. The tones arise from the strong non-linearity imposed by the sgn{ } function, even when the $\Delta\Sigma$ modulator's quantization noise is free of spurious tones. The tone frequencies are multiples of $\alpha f_{ref}$, so they decrease with the fractional frequency value, $\alpha$. Therefore, the LMS feedback loop bandwidth must be made very small to sufficiently attenuate the tones, and this results in very slow adaptive calibration settling. For example, the settling time has been reported in M. Gupta and B. S. Song, "A 1.8 GHz Spur Cancelled Fractional-N Frequency Synthesizer with LMS based DAC Gain Calibration." *IEEE Journal of Solid-State Circuits*. Vol. 41, No. 12, pp. 2842-851, December 2006 to be approximately 1 second.

SUMMARY OF THE INVENTION

An embodiment of the invention is a circuit for adaptive phase noise cancellation for a fractional-N PLL. A preferred embodiment employs a split loop filter architecture. Two loop filter halves separately drive half-sized parallel varactors in a VCO and also drive a differential-input lowpass frequency selective circuit, e.g., a differential integrator, in a least mean squared (LMS) feedback loop. The two varactor capacitances add together in the VCO tank, so the VCO frequency depends on the common-mode loop filter voltage and is relatively insensitive to differential-mode voltage. In contrast, the differential-input lowpass frequency selective circuit operates on the differential-mode voltage from the two loop filter halves but attenuates their common-mode voltage.

BRIEF DESCRIPTION OF THE DRAWINGS to FIG. 1A (prior art) is a block diagram of a fractional-N PLL (FIG. 1A); FIG. 1B illustrates waveforms in the PLL of FIG. 1A;

FIG. 8A is a block diagram of a preferred architecture for the divider of FIG. 5, and FIG. 8B illustrates enable signals;

Figure 5:
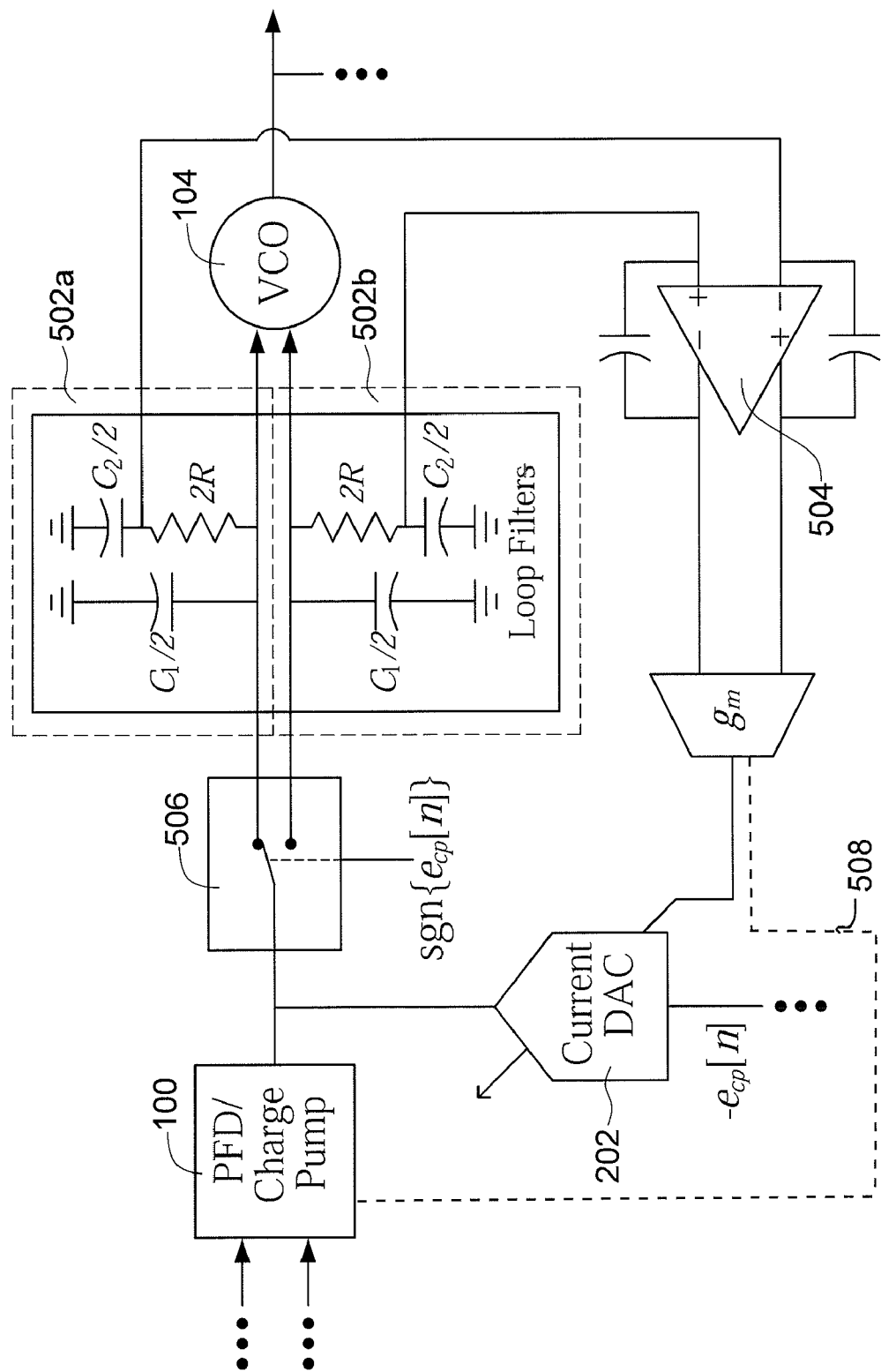
FIG. 5 is a block diagram illustrating a preferred embodiment adaptive calibration method and circuit of the invention.
Figure 9B:
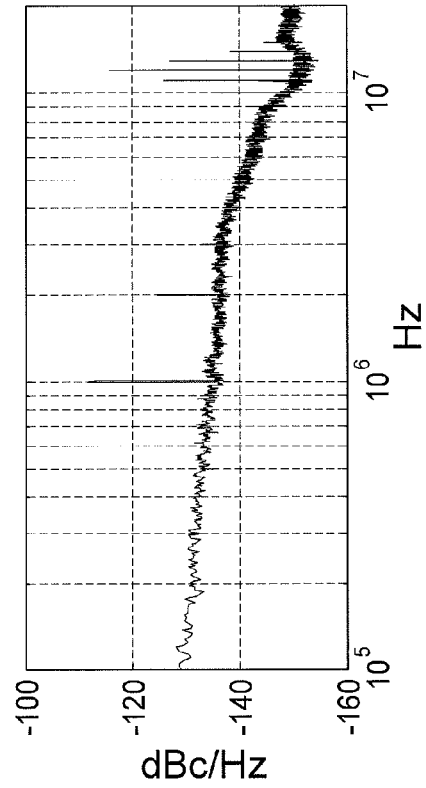
Figure 9D:
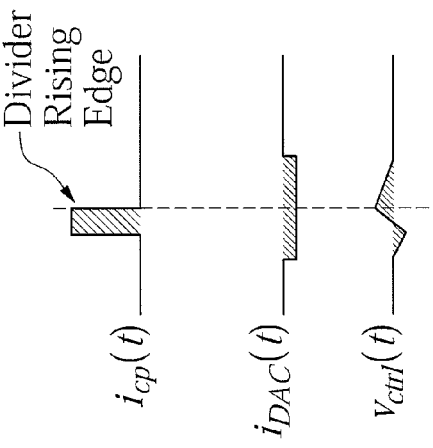
Figure 9A:
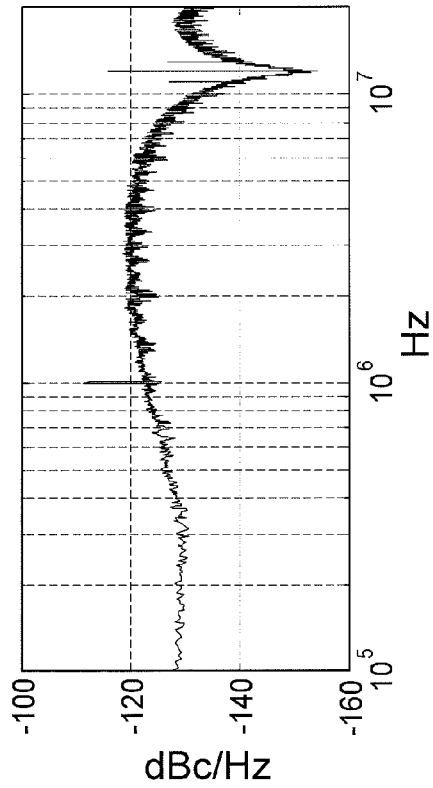
Figure 9C:
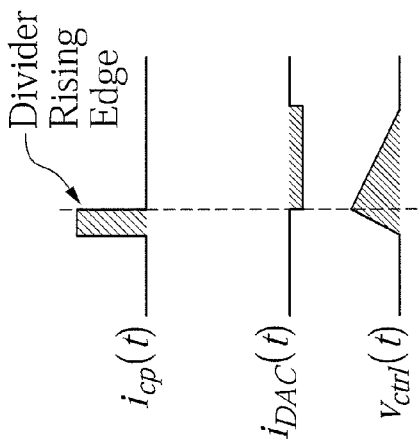
Figures 10A, 10B:
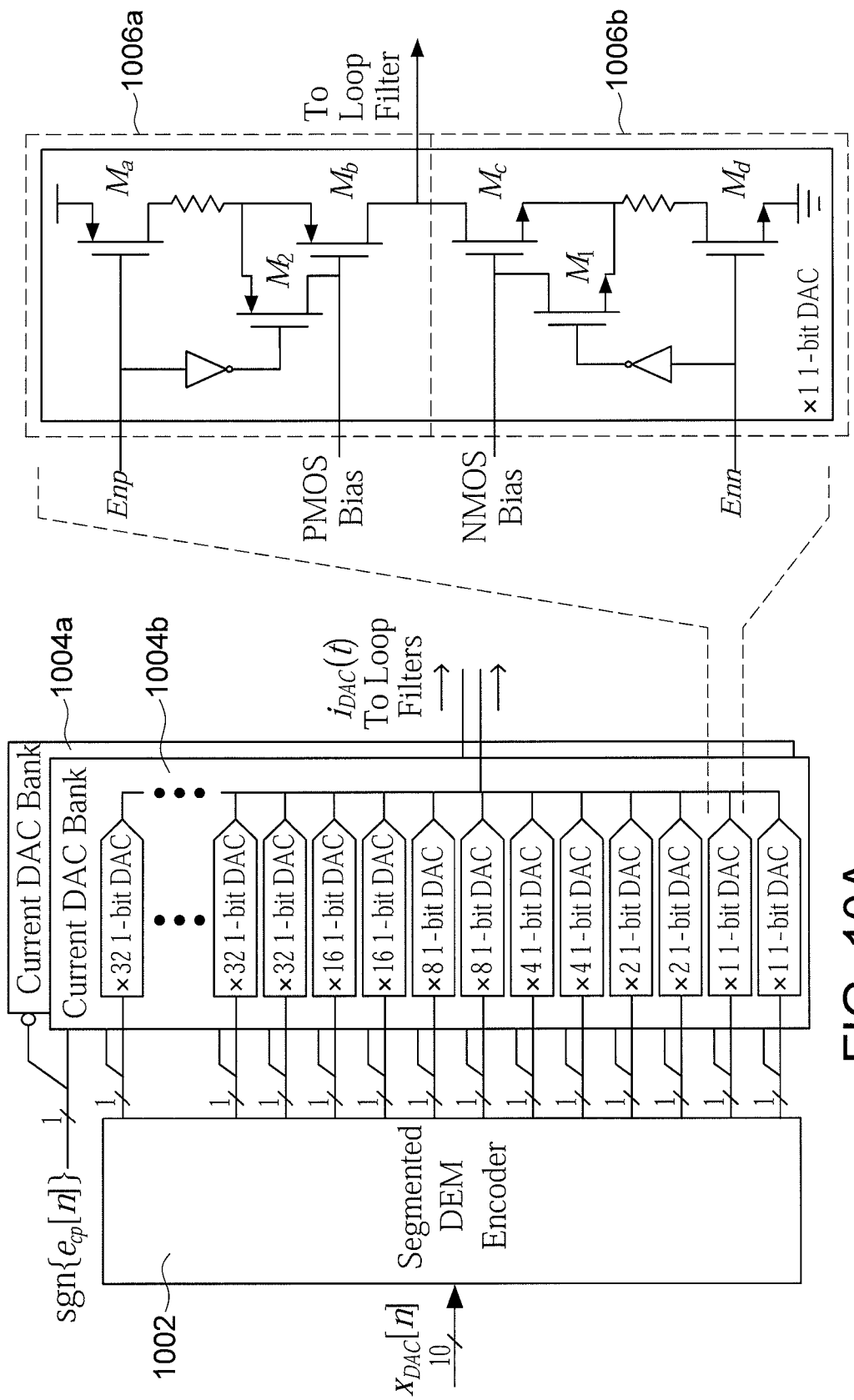
Figure 11:
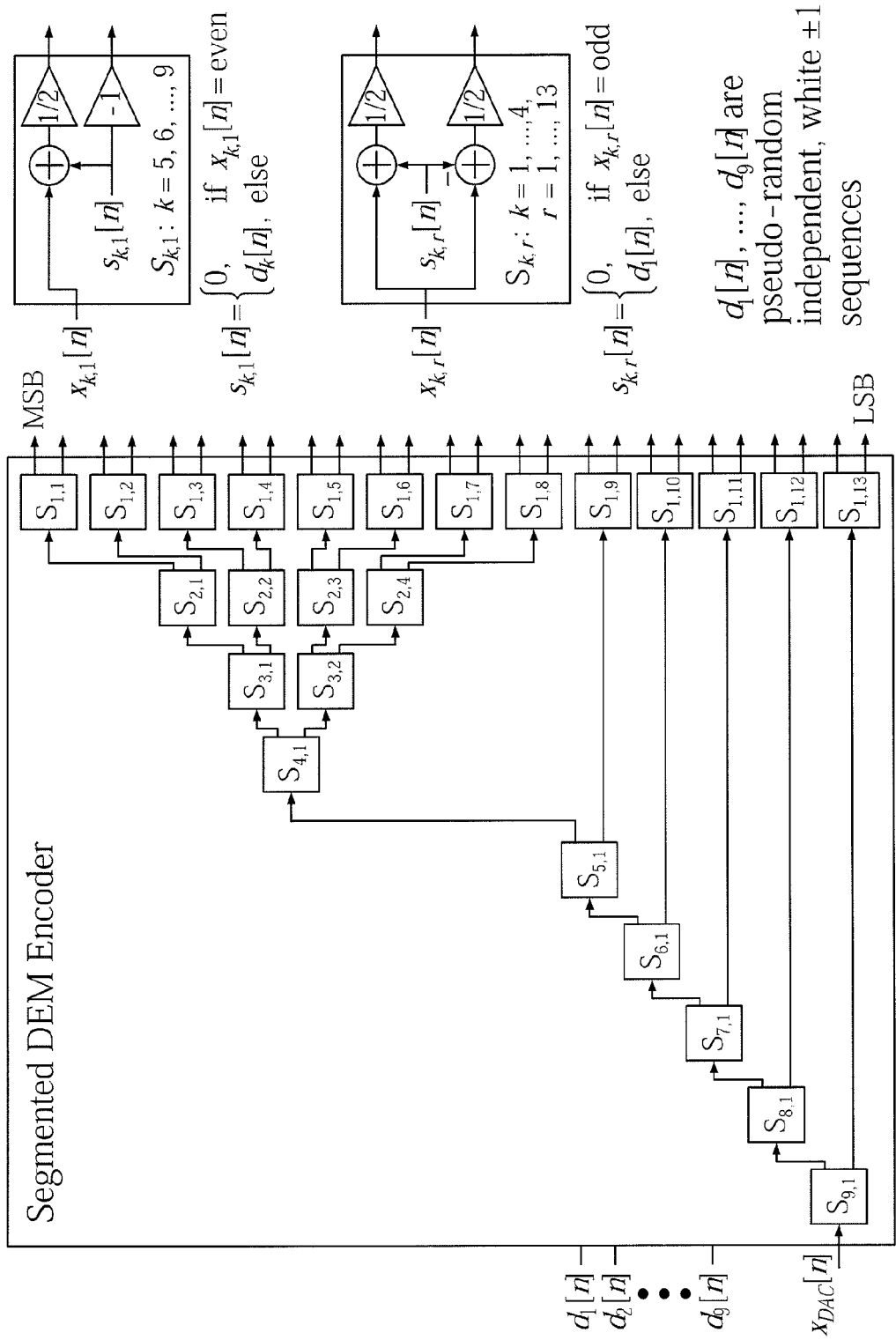
Figure 12:
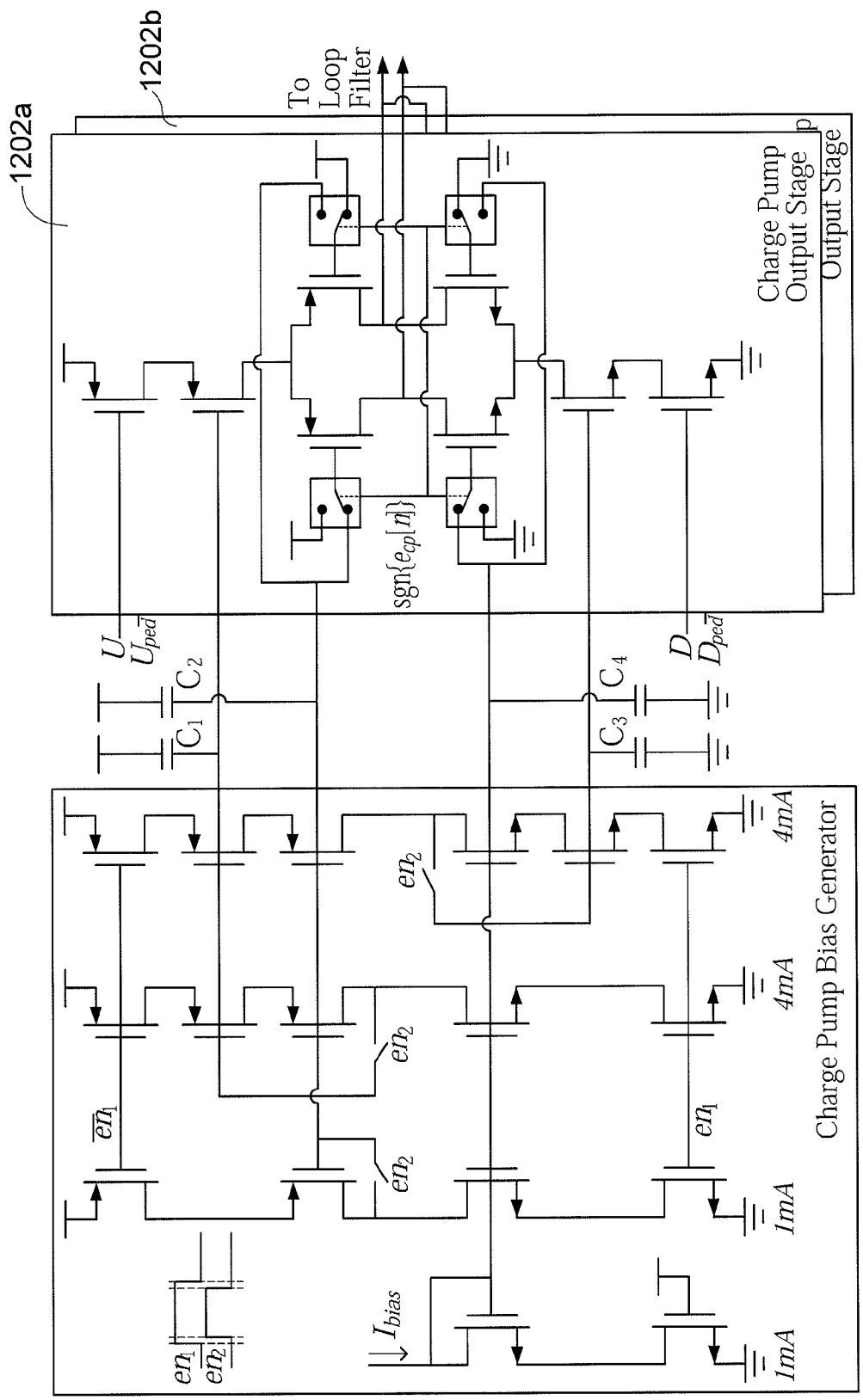
Figure 13:
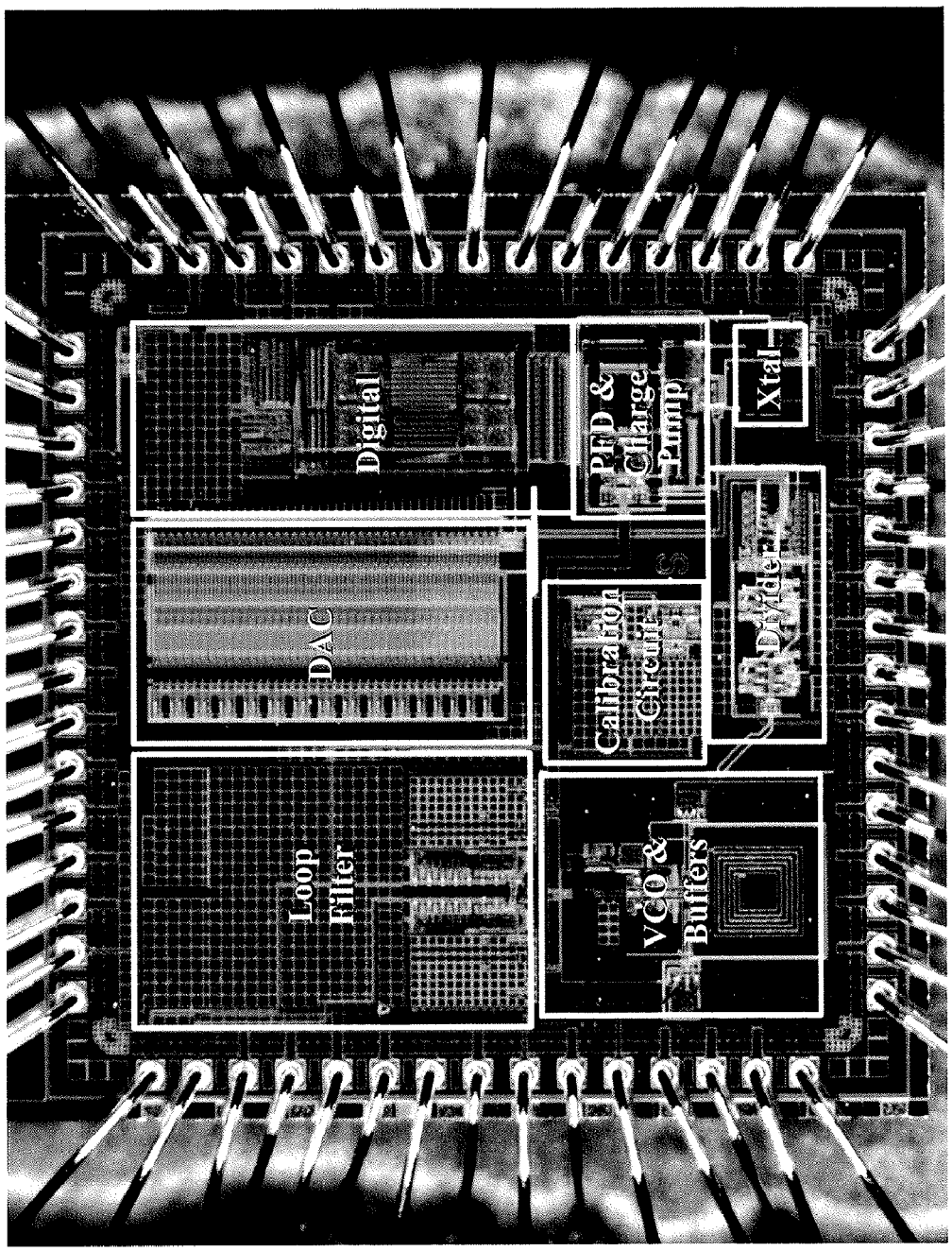
Figure 14:
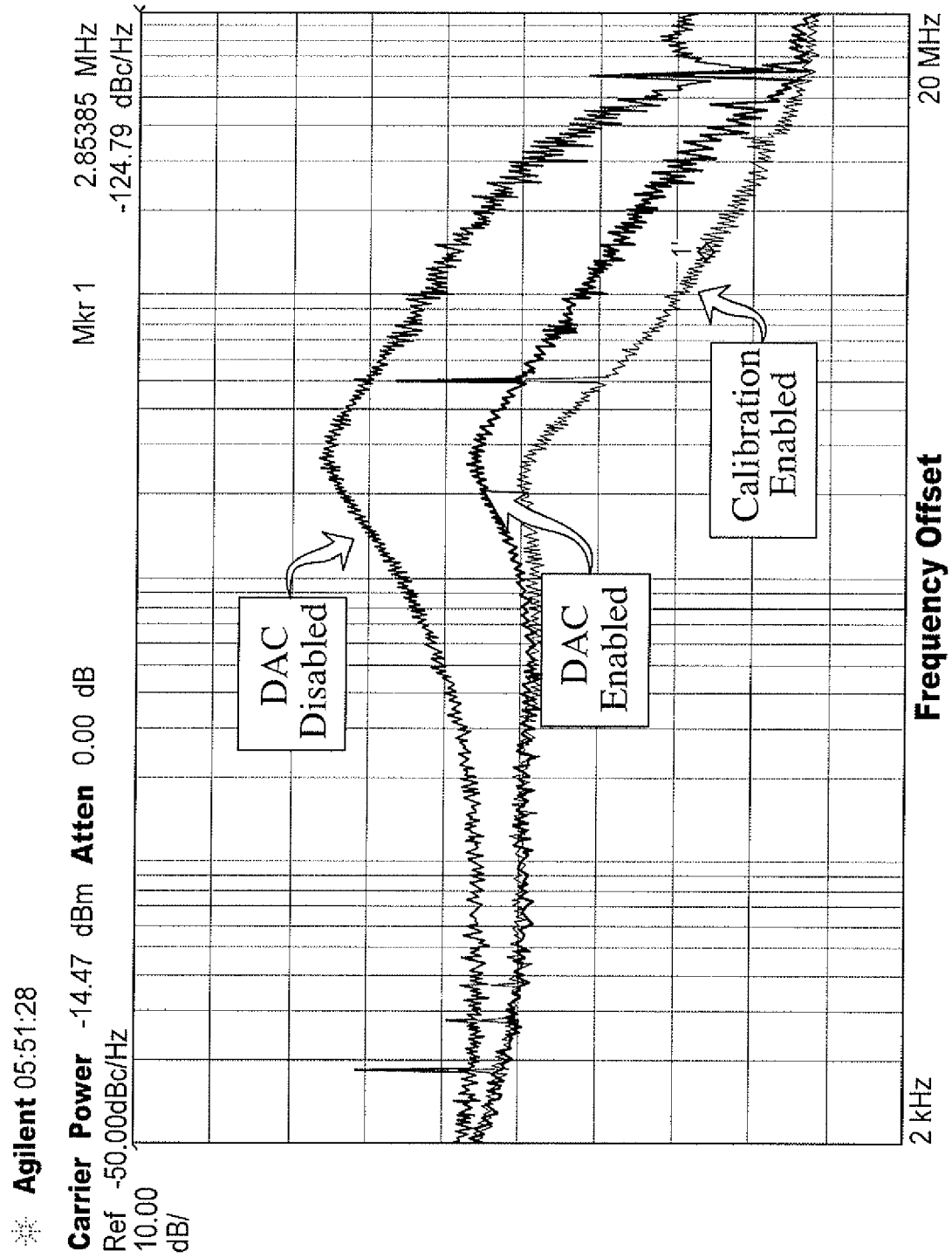
Figure 15:
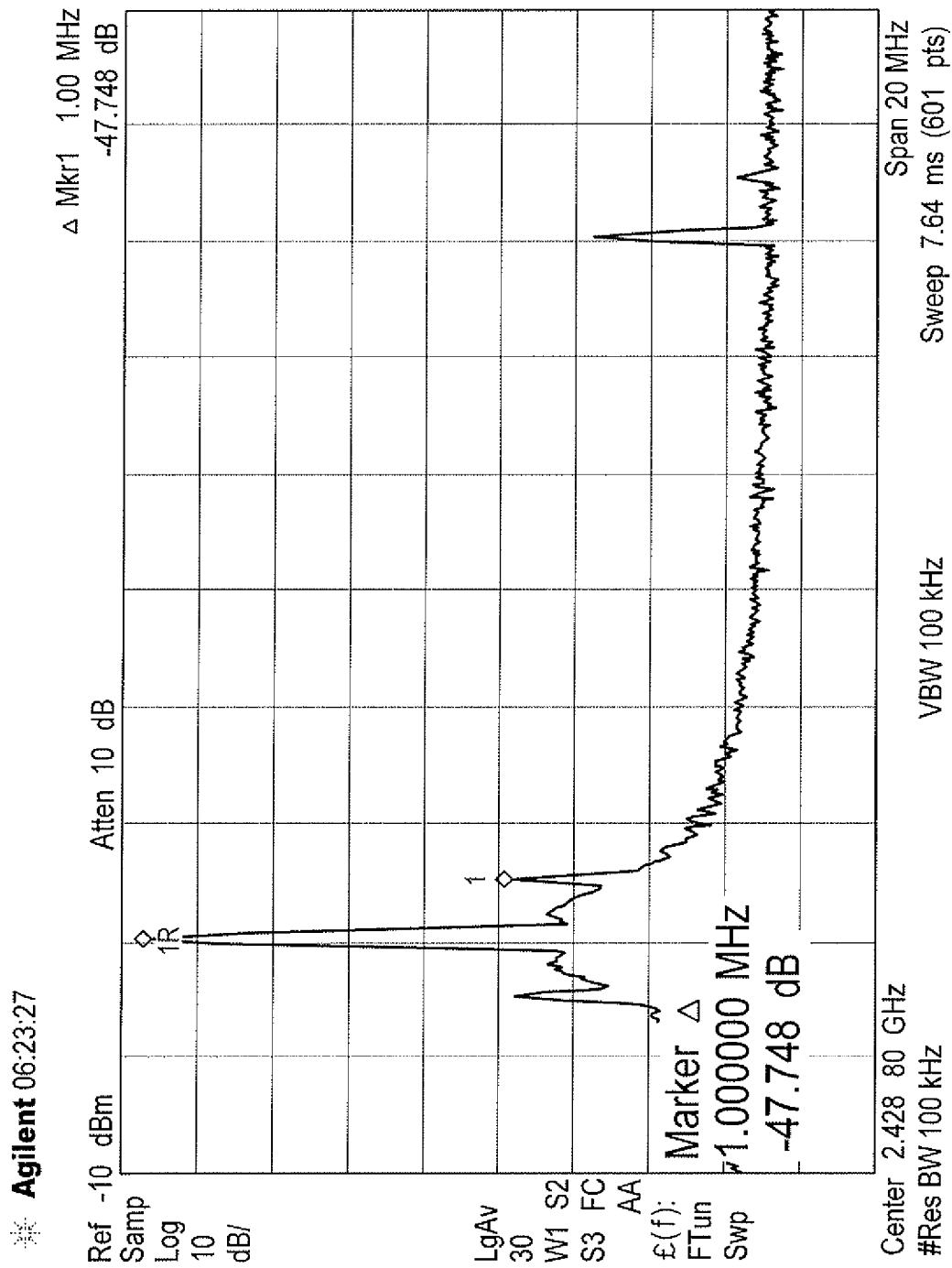
Figure 16:
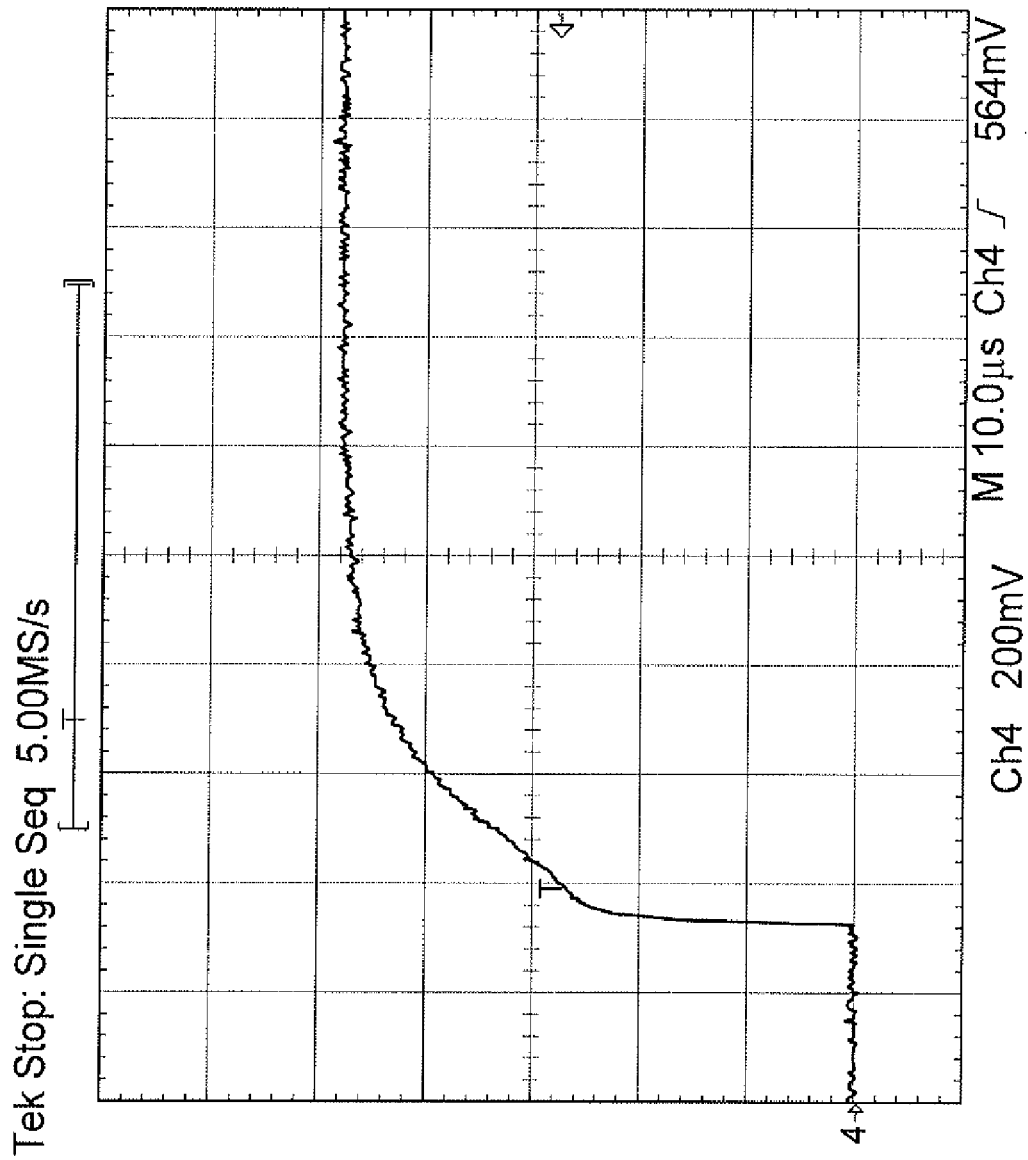

FIG. 9A (prior art) illustrates a DAC pulse aligned with divider rising edge; FIG. 9B (prior art) illustrates simulated PLL phase noise for DAC pulse timing in FIG. 9A; FIG. 9C illustrates a DAC pulse overlapping divider rising edge; FIG. 9D illustrates simulated PLL phase noise for DAC pulse timing in FIG. 9C;

FIGS. 10A and 10B illustrate a preferred architecture and circuit for the DAC of FIG. 5;

FIG. 11 illustrates a preferred segmented dynamic matching encoder;

FIG. 12 illustrates a preferred charge pump circuit with dynamic biasing;

FIG. 13 is a die photograph of a preferred embodiment integrated circuit fractional-N PLL with adaptive phase noise cancellation circuit of the invention;

FIG. 14 is a plot of phase noise for an output frequency of 2.423 GHz of the circuit of FIG. 13;

FIG. 15 is a plot of a representative PLL output spectrum for an output frequency of 2.423 GHz of the circuit of FIG. 13; and FIG. 16 is a plot of the settling performance of the calibration loop of the circuit of FIG. 13.

DETAILED DESCRIPTION OF THE PREFERRED EMBODIMENTS

The invention provides a circuit and method for adaptive phase noise cancellation for a fractional-N PLL. It makes it possible to achieve accurate phase noise cancellation even with low reference frequencies.

An embodiment of the invention is a circuit for adaptive phase noise cancellation for a fractional-N PLL. A preferred embodiment employs a split loop filter architecture. Two loop filter halves separately drive half-sized parallel varactors in a VCO and also drive a differential-input lowpass frequency selective circuit. e.g., a differential-input integrator, in a least mean squared (LMS) feedback loop. The output of the differential-input lowpass frequency selective circuit adjusts the gain of the DAC in the phase noise cancellation path to minimize $\beta$.

The two varactor capacitances add together in the VCO tank, so the VCO frequency depends on the common-mode loop filter voltage and is relatively insensitive to differential-mode voltage. In contrast, the differential-input lowpass frequency selective circuit operates on the differential-mode voltage from the two loop filter halves but attenuates their common-mode voltage. In preferred embodiments, the output signals from the charge pump and DAC are directed to the top or bottom loop filter half according to the sign of the running sum of the to quantization noise introduced by a delta sigma modulator quantizer in the fractional-N PILL.

Embodiments of the present invention give improvement to wide-bandwidth fractional-N PLLs for use in wireless communications applications. Circuits of preferred embodiments can yield lower power consumption, greater is design flexibility and enable on-chip passive-loop filter halves, thus saving pin count.

An experimental integrated circuit (IC) that implements an embodiment of the invention was fabricated and measurements from it indicate that its adaptive calibration causes it to achieve 33 dB of phase noise cancellation in a PLL, with a settling time of 35 μs despite its low reference frequency of 12 MHz. Methods of the invention are capable of providing better performance than the experimental fabrication, as the experimental fabrication reached a noise floor set by other circuit components. Current state of the art in PLLs with passive matching phase noise cancellation have required reference frequencies of 35 MHz, 48 MHz and 50 MHz to achieve 15 dB, 20 dB and 29 dB of phase noise cancellation, respectively, as discussed in the background. The experimental IC that implements an embodiment of the invention but does not achieve the full phase noise cancellation made possible by the invention still is believed to provide a new standard with the 33 dB of noise cancellation with a reference frequency of only 12 MHz, an achievement that is not believed to have been achieved previously for this class of circuits.

Preferred embodiments of the invention are discussed below with respect to the drawings. The drawings include schematic representations, which will be understood by artisans in view of the general knowledge in the art and the description that follows.

The core of the adaptive calibration of the invention is shown in FIG. 5. Two loop filter halves 502a, 502b separately drive half-sized parallel varactors in the VCO and also drive a differential integrator 504, which serves as a differential-input lowpass frequency selective circuit in the LMS feedback loop. The two varactor capacitances add together in the VCO tank, so the VCO frequency depends on the common-mode loop filter voltage and is relatively insensitive to differential-mode voltage. In contrast, the differential integrator 504 operates on the differential-mode voltage from the two loop filter halves but attenuates their common-mode voltage. Since the differential-mode voltage is DC-free, the problem mentioned with respect to the prior art adaptive calibration technique above is avoided. Multiplication by $\text{sgn}\{e_{cp}[n]\}$ is achieved by steering the DAC 202 and charge pump 100 current to the top loop filter 502a whenever $\text{sgn}\{e_{cp}[n]\}=1$ and to the bottom loop filter 502b whenever $\text{sgn}\{e_{cp}[n]\}=-1$ via switch 506, which thereby controls gain matching of the phase noise cancellation path defined by the LMS feedback loop. The path defined by 508 presents an alternative, where the gain of charge pump 100 is controlled instead of the gain of the current DAC 202. In either case, as seen in FIGS. 6B and 6A the dynamics of the LMS calibration loop are determined by a differential-mode half circuit 604, and those of the PLL are determined by common-mode half circuit 602.

Figure 6A:
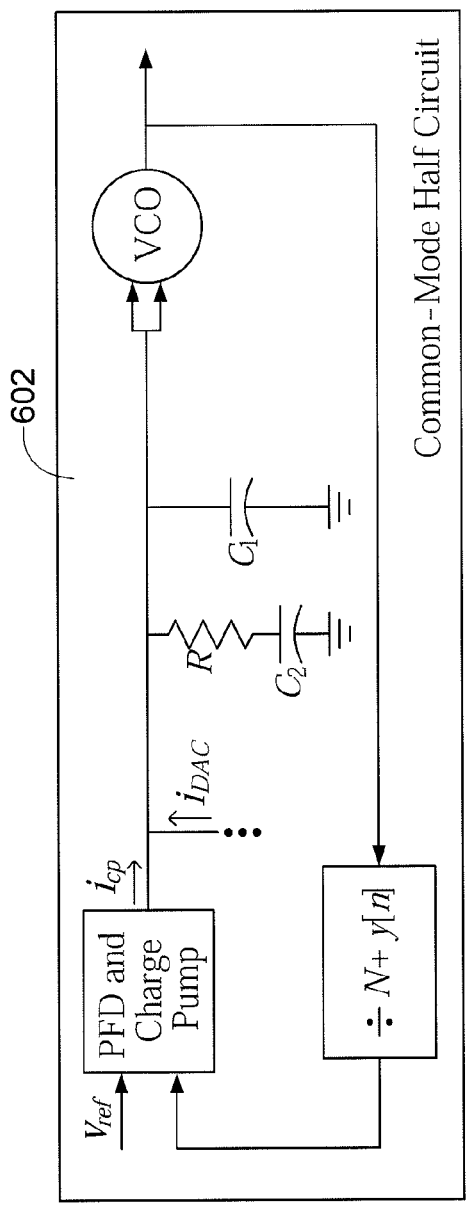
FIGS. 6A and 6B are half-circuit representations of the PLL and the LMS calibration loop of FIG. 5.
Figure 6B:
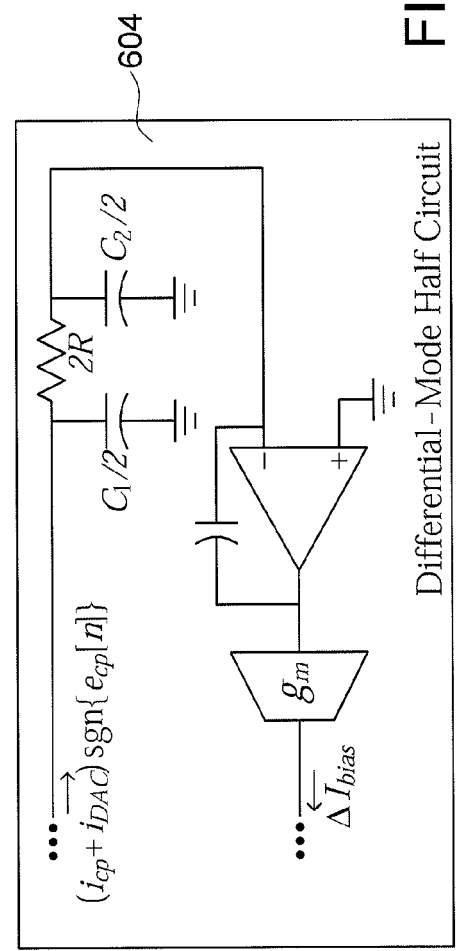

The operation of the LMS calibration loop can be seen from the differential-mode half circuit in FIG. 6B. The current steering operation effectively multiplies the charge pump and DAC pulses each reference period by $\text{sgn}\{e_{cp}[n]\}$. The two pulses are then filtered and integrated as shown in the figure to generate a current, $\Delta I_{bias}$, which is used to adjust the bias current, and therefore the gain, of the DAC. Since the charge pump and DAC pulses are multiplied by $\text{sgn}\{e_{cp}[n]\}$ prior to filtering, the system implements the true sign-error LMS algorithm described above. By avoiding the DC offset problem, the signal that gets integrated by the LMS feedback loop does not contain a term proportional to $\text{sgn}\{e_{cp}[n]\}$. Therefore, the LMS feedback loop bandwidth can be relatively large without significantly degrading the PLL's phase noise performance.

The dynamics of the PLL are implied by the common-mode half circuit shown in FIG. 6A, which is equivalent to the core of a conventional phase noise cancelling PLL. To the extent that the two loop filter half circuits and the two varactor halves are matched, respectively, the current steering operation controlled by $\text{sgn}\{e_{cp}[n]\}$ has no affect the common-mode half circuit. Although mismatches between the two loop filter halves and between the two varactor halves do cause some degradation of the PLL's phase noise in practice, simulation and measurement results indicate that the phase noise resulting from such mismatches is well below that caused by other noise sources in the PLL. Furthermore, careful analysis and simulation indicate that even high levels of differential-mode to common-mode and common-mode to differential-mode conversion do not cause the PLL or the LMS feedback loop to become unstable.

Experimental Circuit Details

Overview

Figure 7:
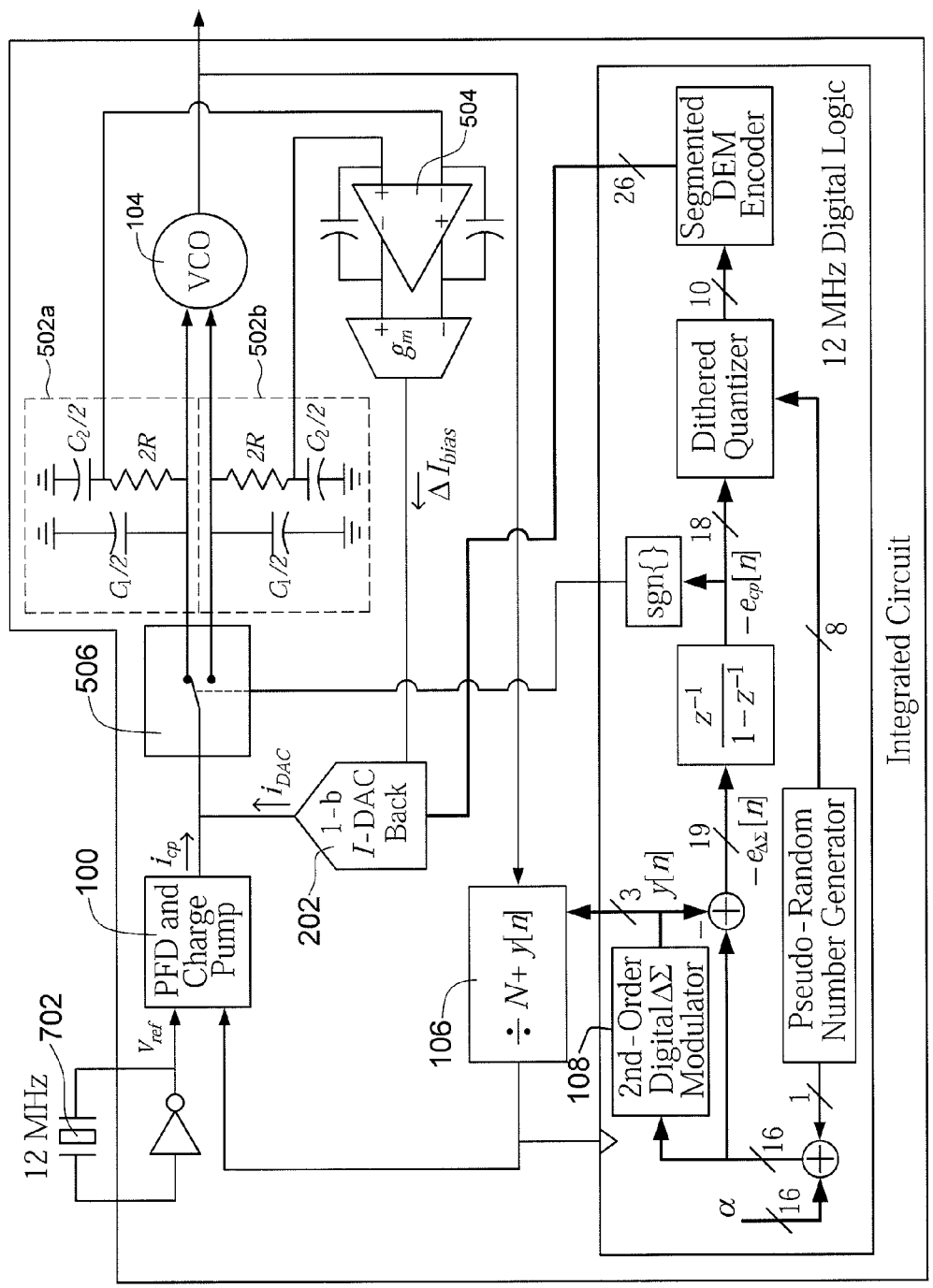
FIG. 7 is a block diagram of a preferred embodiment fractional-N PLL with adaptive phase noise cancellation of the invention.

A block diagram of the experimental IC is shown in FIG. 7. With the exception of 12 MHz reference frequency crystal 702, all blocks shown in the figure are integrated on a single chip, as well as a 3-wire digital interface to control the IC, a VCO output buffer and a buffer connected between the VCO and the divider.

The IC is implemented in the TSMC 0.18 μm single poly, six metal CMOS technology with thin top metal, metal-insulator-metal (MiM) capacitor, poly resistor, and deep n-well process options. All circuitry is operated from a 1.8V supply, and electro-static discharge (ESD) protection circuitry is included for all the pads. Separate deep n-wells and supply domains are used to help provide isolation.

Divider and DAC Pulse Timing

The divider core consists of seven stages of divide-by-two pulse-swallowing blocks 802a-802g as shown in FIG. 8. The two highest frequency blocks 802a and 802b are implemented with current-mode logic (CML) and the remaining five blocks 802c-802g are implemented with CMOS logic with conversion circuits 804, 806 handling CMOS/CML conversion. The output of the divider core is resynchronized to the output of the first CML block to remove jitter from the last six pulse-swallowing blocks, and to reduce modulus-dependent divider delays, i.e., differences between the ideal and actual times of the divider's output edges that depend on N+y[n]. The purpose of the two flip-flops 808, 810 that are clocked by the outputs of the second and third pulse-swallowing blocks, respectively, is to avoid race conditions in the resynchronization circuitry. In addition to $v_{div}(t)$, the divider generates enable signals for the charge pump dynamic bias and DAC circuits.

The use of fixed-width DAC pulses to cancel the quantization noise in fixed-amplitude charge pump pulses causes imperfect cancellation while the pulses are active. Most prior published phase noise cancelling $\Delta\Sigma$ fractional-N PLLs align the rising edge of each DAC pulse with a rising edge of $v_{div}(t)$ as shown in FIG. 9A. To the extent that the DAC and charge pump pulses do not overlap, the loop filter is disturbed significantly before the charge delivered by the two pulses cancel each other. For example, if the charge pump pulse occurs before the DAC pulse as shown in FIG. 9A, the entire charge pump pulse is injected into the loop filter before its charge is cancelled by the DAC pulse. This disturbs $v_{ctrl}(t)$ and contributes to the overall PLL phase noise more than would occur if the charge pump and DAC pulses were timed to overlap each other as shown in FIG. 9C.

Simulated PSDs of the PLL phase noise caused by the disturbance of $v_{ctrl}(t)$ during the charge pump and DAC pulses for the two cases shown in FIGS. 9A and 9C are shown in FIGS. 9B and 9D, respectively. As indicated by the simulation results, the timing modification implemented in the invention relative to typical previous designs discussed in the background significantly reduces the phase noise resulting from the inherent mismatch between the amplitude modulated DAC pulses and the width-modulated charge pump pulses.

Cancellation Path Circuitry

The architecture of the 10-bit current-steering DAC 202 is shown in FIGS. 10A and 10B. The DAC consists of a segmented dynamic element matching (DEM) encoder 1002 followed by two banks of 26 weighted, return-to-zero, one-bit current DACs 1004a, 1004b. The outputs of the one-bit current DACs in each bank are connected to one of the two loop filter halves. Alternatively, the FIGS. 10A and 10B split architecture is applicable to the charge pump 100, in which case the banks 1004a and 1004b are separately enabled charge pump banks. During each reference period, one or the other of the two banks of one-bit current DACs is enabled depending upon the sign of sgn{$e_{cp}[n]$}. This alternate enablement of the DAC banks 1004a and 1004b (or of charge pump banks) implements the function of the current steering switch 506 shown in FIG. 7 for the current pulses from the 10-bit DAC. In each of the DAC banks 1004a, 1004b there are 16 one-bit current DACs with a weight of 32 LSBs, and five pairs of one-bit current DACs with weights of 1, 2, 4, 8, and 16 LSBs, respectively.

As seen in FIG. 10B, each one-bit current DAC consists of two resistively degenerated current sources 1006a, 1006b that are enabled in a manner similar to that of the charge pump. Large devices are used to minimize mismatches. Unfortunately, this causes the channel charge contained in $M_a$, $M_b$, $M_c$ and $M_d$ to be large relative to the charge in the current pulse from the one-bit DAC. When the current source is switched off, this unwanted channel charge is injected into the loop filter 502. To mitigate this problem, transistors $M_1$ and $M_2$ are used to short the source and gate of $M_b$ and of $M_c$ at the end of each DAC current pulse. This causes most of the channel charge to be injected into the DAC bias line 504 instead of the loop filter 502. The resulting disturbance of the DAC bias occurs at the end of the DAC current pulse, and the bias voltages have enough time to settle to their correct values prior to the next pulse, at which time $M_1$ and $M_2$ are opened.

The purpose of the DEM encoder 102 is to prevent amplitude and transient errors arising from component mismatches among the one-bit current DACs from introducing harmonic distortion. The details of the DEM encoder are shown in FIG. 11. Its architecture and functionality are similar to those of the DEM encoder presented, K-L Chan and I. Galton, "A 14b 100 MS/s DAC with fully segmented dynamic element matching," *International Solid-State Circuits Conference*, pp. 390-391, February 2006.

Although $e_{cp}[n]$ is an 18-bit digital number as shown in FIG. 7, it is requantized to 10-bits to reduce the required precision of the DAC. An 8-bit pseudo-random sequence is added to the least-significant bits of $e_{cp}[n]$, and the result is truncated to 10-bits to ensure that the requantization process does not introduce harmonic distortion.

Charge Pump Noise Issues in Wide Bandwidth PLLs

The average current consumed by a charge pump output stage is very low, because the charge pump is only on for a small portion of each reference period. However, in most designs the charge pump bias generator is left on. Had this been done on the IC, the charge pump would have consumed an average current of just over 10 mA which is more than 50% of the current consumed by all the other circuit blocks in the PLL combined.

Instead, current is saved by powering up most of the circuitry in the charge pump bias generator for only ⅛ of each reference period just before the charge pump output stage is turned on. The dynamic biasing idea was proposed in J. Lee, S-O Lee. M. Yoh, I. Ryu and B-H Park. "A 13 mW 2 GHz/520 MHz Dual-Band Frequency Synthesizer for PCS Applications." *Journal of the Korean Physical Society*, vol. 39, no. 1, pp. 8-13, July 2001 without a description of the circuit details. The circuit used to implement dynamic biasing in the preferred experimental IC is shown in FIG. 12. On average, the dynamic biasing circuit reduces the average current consumption of the charge pump by almost 8 mA.

The PFD is identical to that described in S. Pamarti, L. Jansson. I. Galton. "A wideband 2.4 GHz ΔΣ fractional-N PLL with 1 Mb/s in-loop modulation," *IEEE Journal of Solid-State Circuits*, vol. 39, no. 1, pp. 49-62, January 2004. It generates signals U, D, $U_{ped}$, and $D_{ped}$ which control the two charge pump output stages 1202a, 1202b shown in FIG. 12. Together, the PFD and charge is pump realize a linearization scheme that reduces errors from mismatches between the positive and negative charge pump currents.

Other Circuitry

The VCO is a negative-$g_m$ CMOS LC oscillator with a differential spiral inductor stacked in metal layers 5 and 6. As described above, it is modified relative to a conventional VCO in that it has two half-sized parallel varactors instead of a single varactor. The nominally equal MOS varactors provide tuning over a 0.6V-1.2V range with a nominal $K_{VCO}$ of 60 MHz/V from each input. Coarse digital tuning is provided by switching MIM capacitors of 20 fF and 80 fF into the VCO tank. This allows the VCO to operate over the full 2.4 GHz ISM band, See, e.g., S. T. Lee, S. J. Fang, D. J. Allstot, A. Bellaouar. A. R. Fridi, and P. A. Fontaine, "A Quad-Band GSM-GPRS transmitter with digital auto-calibration," *IEEE Journal of Solid-State Circuits*, vol. 39, no. 12, pp. 2200-2214, December 2004. Two buffers are AC coupled to the VCO, and separately drive the divider and an off-chip 50Ω load.

The fully integrated loop filter consists of two 5 kΩ polysilicon resistors, two 18 pF MiM capacitors, and two 282 pF pMOS capacitors. Coarse digital tuning is provided to account for process variations. A folded cascode, single-stage OTA followed by a simple voltage to current converter is used in the LMS feedback loop.

Experimental Measurement Results

A photograph of the IC die is shown in FIG. 13. The die measures 2.2 mm by 2.2 mm including ESD devices and pads. The IC was tested in a 32 pin QFN package.

The current consumption of the PLL circuitry in the IC is 20.9 mA with the dynamic charge pump bias technique enabled. When the dynamic charge pump bias technique is disabled, the total current consumption increases by 8 mA although neither the phase noise or spurious performance change measurably. Therefore, all of the measured results described below were obtained with the dynamic charge pump bias technique enabled.

The IC was tested at 1 MHz frequency steps from 2.4 to 2.48 GHz. Table 1 summarizes the worst-case performance of the IC over these frequencies with the adaptive phase noise cancellation technique enabled and disabled. The measured loop bandwidth was 730 kHz in all cases. The worst case spot phase noise with the adaptive phase noise cancellation technique enabled is −101 dBc/Hz and −124 dBc/Hz at 100 kHz and 3 MHz offsets respectively, with no significant variation over the tested frequencies. Table 2 summarizes the performance of the PLL compared with relevant prior art.

FIGS. 14 and 15 show representative PSD plots of the PLL's phase noise and output signal, respectively, for an output frequency of 2.423 GHz. FIG. 14 shows the phase noise with the DAC disabled, the DAC enabled without adaptive calibration, and the DAC enabled with adaptive calibration. The difference of 20 dB between the first two cases corresponds to the native cancellation path matching. Enabling the calibration technique further reduces the phase noise by 13 dB. The measured reduction in spot phase noise at a 3 MHz offset resulting from the phase noise cancellation with adaptive calibration enabled is 33 dB.

The output of the calibration loop's OTA optionally can be connected to an output pin through a MOS transistor switch for calibration settling time measurements. A representative waveform from this pin measured as the calibration loop settled is shown in FIG. 16 and indicates a settling time of 35 µs. Several such measurements were made for different PLL output frequencies. The results show that the settling time does not vary significantly as a function of the PLL's output frequency.

TABLE I

| Design Details | |
|---|---|
| Technology | TSMC 0.18 µm 1P6M CMOS |
| Package and Die Area | 32 pin TQFN, 2.2 × 2.2 mm$^2$ |
| Reference Frequency | 12 MHz |
| Output Frequency | 2.4-2.5 GHz |
| Measured Loop Bandwidth | >730 kHz |

TABLE I-continued

| Measured Current Consumption (at 1.8 V) | | |
|---|---|---|
| VCO and Divider Buffer | 6.9 mA | 20.9 mA |
| Divider | 5.8 mA | |
| CP (with dynamic biasing), PFD and buffers | 2.7 mA | |
| Digital | 0.5 mA | |
| DAC | 3.6 mA | |
| Calibration | 1.4 mA | |
| Crystal Buffer | 4.1 mA | 9.4 mA |
| External Buffer | 5.3 mA | |
| Measured Integer-N Performance | | |
| Phase Noise @ 100 kHz | −104 dBc/Hz | |
| Phase Noise @ 3 MHz | −126 dBc/Hz | |
| Measured Performance, DAC and Calibration Technique Disabled | | |
| Phase Noise @ 3 MHz | −91 dBc/Hz | |
| Fractional Spur @ 1 MHz | −40 dBc | |
| Fractional Spur @ 2 MHz | −42 dBc | |
| Fractional Spur @ ≧3 MHz | −45 dBc | |
| Measured Performance, DAC and Calibration Technique Enabled | | |
| Phase Noise @ 100 kHz | −101 dBc/Hz | |
| Phase Noise @ 3 MHz | −124 dBc/Hz | |
| Fractional Spur @ 1 MHz | −47 dBc | |
| Fractional Spur @ 2 MHz | −57 dBc | |
| Fractional Spur @ ≧3 MHz | −62 dBc | |
| Reference Spur | −53 dBc | |

TABLE II

| | E. Temporiti, G. Albasini, I. Bietti, R. Castello, M. Colombo. "A 700 kHz Bandwidth ΣΔ Fractional Synthesizer with Spurs Compensation and Linearization Techniques for WCDMA Applications," IEEE Journal of Solid-State Circuits, vol. 39, no. 9, pp. 1446-1454, September 2004. | S. Pamarti, L. Jansson, I. Galton. "A wideband 2.4 GHz ΔΣ fractional-N PLL with 1 Mb/s in-loop modulation," IEEE Journal of Solid-State Circuits, vol. 39, no. 1, pp. 49-62, January 2004. | S. E. Meninger, and M. H. Perrott. "A 1 MHz bandwidth 3.6 GHz 0.18 um CMOS fractional-N synthesizer utilizing a hybrid PFD/DAC structure for reduced broadband phase noise," IEEE Journal of Solid-State Circuits, vol. 41, no. 4, pp. 966-980, April 2006. | M. Gupta and B. S. Song. "A 1.8 GHz spur cancelled fractional-N frequency synthesizer with LMS based DAC gain calibration," IEEE Journal of Solid-State Circuits, vol. 41, no. 12, pp. 2842-2851, December 2006. | Invention |
|---|---|---|---|---|---|
| Output Frequency | 2.1 GHz | 2.4 GHz | 3.6 GHz | 1.8 GHz | 2.4 GHz |
| Reference Frequency | 35 MHz | 48 MHz | 50 MHz | 14.33 MHz | 12 MHz |
| Loop Bandwidth | 700 kHz | 460 kHz | 1 MHz | 400 kHz | 730 kHz |
| Inband Phase Noise | −104 dBc/Hz | −96 dBc/Hz | −98 dBc/Hz | −98 dBc/Hz | −101 dBc/Hz |
| Phase Noise at 3 MHz offset | −123 dBc/Hz | −121 dBc/Hz | −120 dBc/Hz | −123 dBc/Hz | −124 dBc/Hz |
| Calibration Settling Time | No calibration | No calibration | No calibration | 1 s | 35 µs |
| Phase Noise Cancellation | 15 dB | 20 dB | 29 dB | 30 dB | 33 dB |
| Power Consumption | 28 mW | 67 mW | 110 mW | 29 mW | 38 mW |
| Die Area | 3.4 mm$^2$ | 6.5 mm$^2$ | 7.3 mm$^2$ | 2 mm$^2$ | 4.8 mm$^2$ |
| Technology | 0.18 µm CMOS | 0.18 µm CMOS | 0.18 µm CMOS | 0.18 µm CMOS | 0.18 µm CMOS |

The invention claimed is:

1. A circuit for adaptive phase noise cancellation in a fractional-N PLL, the circuit comprising:
two loop filter halves that separately drive half-sized parallel varactors in a VCO and also drive a differential-input lowpass frequency selective circuit in a feedback loop, wherein varactor capacitances of the half-sized parallel varactors add together in the VCO, the VCO frequency depends on a common-mode loop filter voltage from the two loop filter halves and is relatively insensitive to a differential-mode voltage from the two loop filter halves; and the differential-input lowpass frequency selective circuit operates on the differential-mode voltage from the two loop filter halves and is relatively insensitive to their common-mode voltage.

2. The circuit of claim 1 wherein the differential-input lowpass frequency selective circuit comprises a differential-input integrator circuit.

3. The circuit of claim 1 further comprising a phase noise cancellation path, the phase noise cancellation path comprising the differential-input lowpass frequency selective circuit and a digital-to-analog converter (DAC), wherein an output of the DAC is combined with an output signal of a charge pump to cancel quantization noise introduced by a quantizer that generates a divider modulus sequence in the fractional-N PLL, and wherein gain matching of the phase noise cancellation path is controlled by an output of the differential-input lowpass frequency selective circuit.

4. The circuit of claim 3 wherein a function of the output signal from the differential-input lowpass frequency selective circuit adjusts a gain of the DAC to control the gain matching of the phase noise cancellation path.

5. The circuit of claim 3 wherein a function of the output signal from the differential-input lowpass frequency selective circuit adjusts a gain of the charge pump to control the gain matching of the phase noise cancellation path.

6. The circuit of claim 3, further comprising means for applying the output signal of the charge pump and the output signal of the DAC to an input of one or the other of the two separate loop filter halves according to a state of a digital control bit.

7. The circuit of claim 6, wherein the digital control bit is set as a function of quantization noise introduced by the quantizer that generates the divider modulus sequence in the fractional-N PLL.

8. The circuit of claim 6, wherein the digital control bit is set according to a sign of a running sum of the quantization noise introduced by the quantizer that generates the divider modulus sequence in the fractional-N PLL.

9. A circuit for adaptive phase noise cancellation in a fractional-N PLL, the circuit comprising:
two loop filter halves that separately drive half-sized parallel varactors in a VCO and also drive a differential-input lowpass frequency selective circuit in a feedback loop, wherein varactor capacitances of the half-sized parallel varactors add together in the VCO, the VCO frequency depends on a common-mode voltage from the two loop filter halves and is relatively insensitive to a differential-mode voltage from the two loop filter halves; and the differential-input lowpass frequency selective circuit operates on the differential-mode voltage from the two loop filter halves and is relatively insensitive to the common-mode voltage,
a phase noise cancellation path, the phase noise cancellation path comprising the differential-input lowpass frequency selective circuit and a digital-to-analog converter (DAC), wherein an output signal of the DAC is combined with an output signal of a charge pump to cancel quantization noise introduced by a quantizer used to generate a divider modulus sequence in the fractional-N PLL, and wherein gain matching of the phase noise cancellation path is controlled by an output signal of the differential-input lowpass frequency selective circuit; and
means for applying the output signal of the charge pump and the output signal of the DAC to an input of one or the other of the two separate loop filter halves according to a state of a digital control bit;
wherein the means for applying comprises two nominally identical DACs that are enabled and disabled depending upon the state of the digital control bit such that only one of the DACs is enabled at any given time.

10. A circuit for adaptive phase noise cancellation in a fractional-N PLL, the circuit comprising:
two loop filter halves that separately drive half-sized parallel varactors in a VCO and also drive a differential-input lowpass frequency selective circuit in a feedback loop, wherein varactor capacitances of the half-sized parallel varactors add together in the VCO, the VCO frequency depends on a common-mode voltage from the two loop filter halves and is relatively insensitive to a differential-mode voltage from the two loop filter halves; and the differential-input lowpass frequency selective circuit operates on the differential-mode voltage from the two loop filter halves and is relatively insensitive to the common-mode voltage,
a phase noise cancellation path, the phase noise cancellation path comprising the differential-input lowpass frequency selective circuit and a digital-to-analog converter (DAC), wherein an output signal of the DAC is combined with an output signal of a charge pump to cancel quantization noise introduced by a quantizer used to generate a divider modulus sequence in the fractional-N PLL, and wherein gain matching of the phase noise cancellation path is controlled by the output an output signal of the differential-input lowpass frequency selective circuit; and
means for applying the output signal of the charge pump and the output signal of the DAC to an input of one or the other of the two separate loop filter halves according to a state of a digital control bit;
wherein the means for applying comprises two nominally identical charge pump circuits that are enabled and disabled depending upon the state of the digital control bit such that only one of the charge pump circuits is enabled at any given time.

11. A circuit for adaptive phase noise cancellation in a fractional-N PLL, the circuit comprising:
means for controlling output frequency of a voltage controlled oscillator in the fractional-N PLL with a common mode voltage of a loop filter having substantially matched loop filter halves, said means for controlling separately driving half-sized parallel varactors in the voltage controlled oscillator to make the voltage controlled oscillator frequency depend on the common mode voltage and be relatively insensitive to a differential-mode voltage of the loop filter having the substantially matched loop filter halves; and means for driving a differential-input lowpass frequency selective circuit within a feedback loop with the differential-mode voltage of the loop filter having the substantially matched loop filter halves.

12. The circuit of claim 11, further comprising means for directing feedback signals within the fractional-N PLL and the feedback loop to one or the other of the two halves of the loop filter having substantially matched loop filter halves according to a function of quantization noise.

13. A method for adaptive phase noise cancellation in a fractional-N PLL, the method comprising steps of:

applying a common mode output voltage from substantially matched loop filter halves that separately drive half-sized parallel varactors in a voltage controlled oscillator to control the frequency of the voltage controlled oscillator of the fractional-N PLL with the common mode output voltage and make the frequency of the voltage controlled oscillator relatively insensitive to a differential mode output voltage from the substantially matched loop filter halves;

applying the differential mode output voltage from the substantially matched loop filter halves to a differential-input lowpass frequency selective circuit in a phase noise cancellation feedback loop of the fractional-N PLL to control gain matching of the phase noise cancellation feedback loop.

* * * * *

UNITED STATES PATENT AND TRADEMARK OFFICE
CERTIFICATE OF CORRECTION

| | | |
|---|---|---|
| PATENT NO. | : 7,999,622 B2 | |
| APPLICATION NO. | : 12/352293 | |
| DATED | : August 16, 2011 | |
| INVENTOR(S) | : Ian Galton et al. | |

It is certified that error appears in the above-identified patent and that said Letters Patent is hereby corrected as shown below:

In the Specification:

| | |
|---|---|
| Col. 3, line 42 | After "embodiments to", please delete "is". |
| Col. 3, line 53 | Please delete "$v_{ctrl}(t)$" and insert --$v_{ctrl}(t)$-- therefor. |
| Col. 4, line 22 | After "Jansson,", please delete "1." and insert --I.-- therefor. |
| Col. 4, line 27 | Please delete "um" and insert --µm-- therefor. |
| Col. 4, line 36 | Please delete "Saved" and insert --Sayed-- therefor. |
| Col. 4, line 40 | Please delete "$\beta Q_{cp-\Delta\Sigma}[n]=\beta T_{VCO}I_{CP}e_{cp}[n]$" and insert --βQcp-ΔΣ[n] = βTVCOICPecp[n]-- therefor. |
| Col. 4, line 42 | Please delete "$e_{cp}[n]$" and insert --ecp[n]-- therefor. |
| Col. 4, line 50 | Please delete "sgn{$e_{cp}[n]$}" and insert --sgn{ecp[n]}-- therefor. |
| Col. 4, lines 52-53 | Please delete "$e_{cp}[n]$sgn{$e_{cp}[n]$}=|$e_{cp}[n]$|" and insert --ecp[n]sgn{ecp[n]} = |ecp[n]|-- therefor. |
| Col. 4, line 61 | Please delete "$e_{cp}[n]$" and insert --ecp[n]-- therefor. |
| Col. 4, line 67 | Please delete "$v_{ctrl}(t)$" and insert --vctrl(t)-- therefor. |
| Col. 4, line 67 | Please delete "sgn{$e_{cp}[n]$}" and insert --sgn{ecp[n]}-- therefor. |
| Col. 5, line 5 | Please delete "$v_{ctrl}(t)$" and insert --vctrl(t)-- therefor. |

Signed and Sealed this
Twenty-ninth Day of May, 2012

David J. Kappos
*Director of the United States Patent and Trademark Office*

CERTIFICATE OF CORRECTION (continued)
U.S. Pat. No. 7,999,622 B2

Figure 1A:
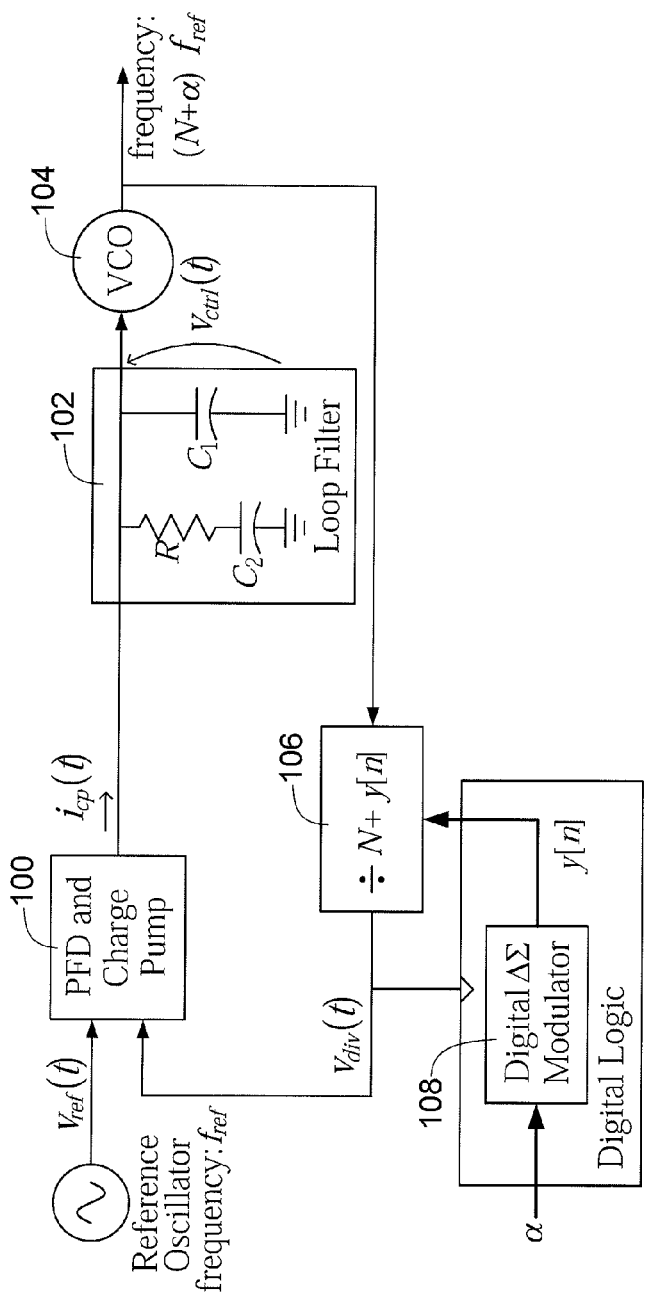
Figure 1B:
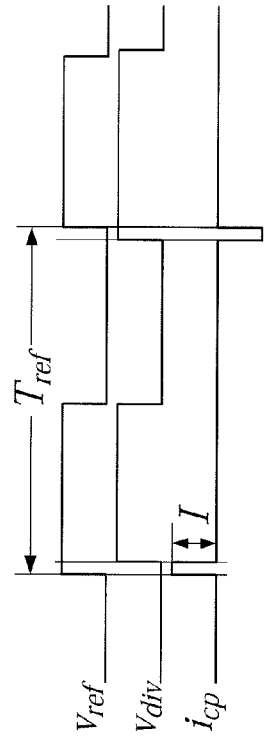
Figure 2:
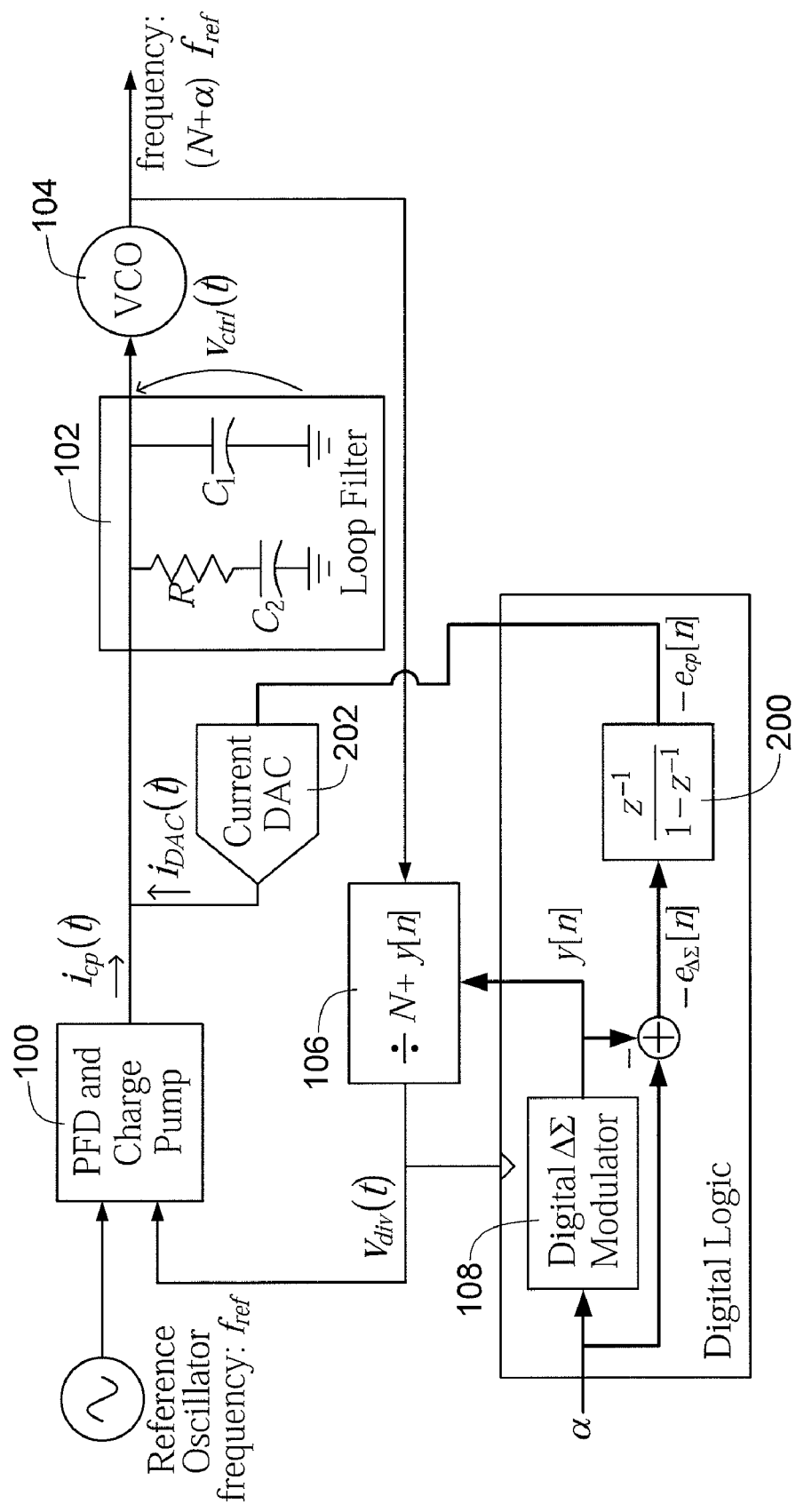
FIG. 2 (prior art) is a block diagram of a phase noise cancelling fractional-N PLL.
Figure 3:
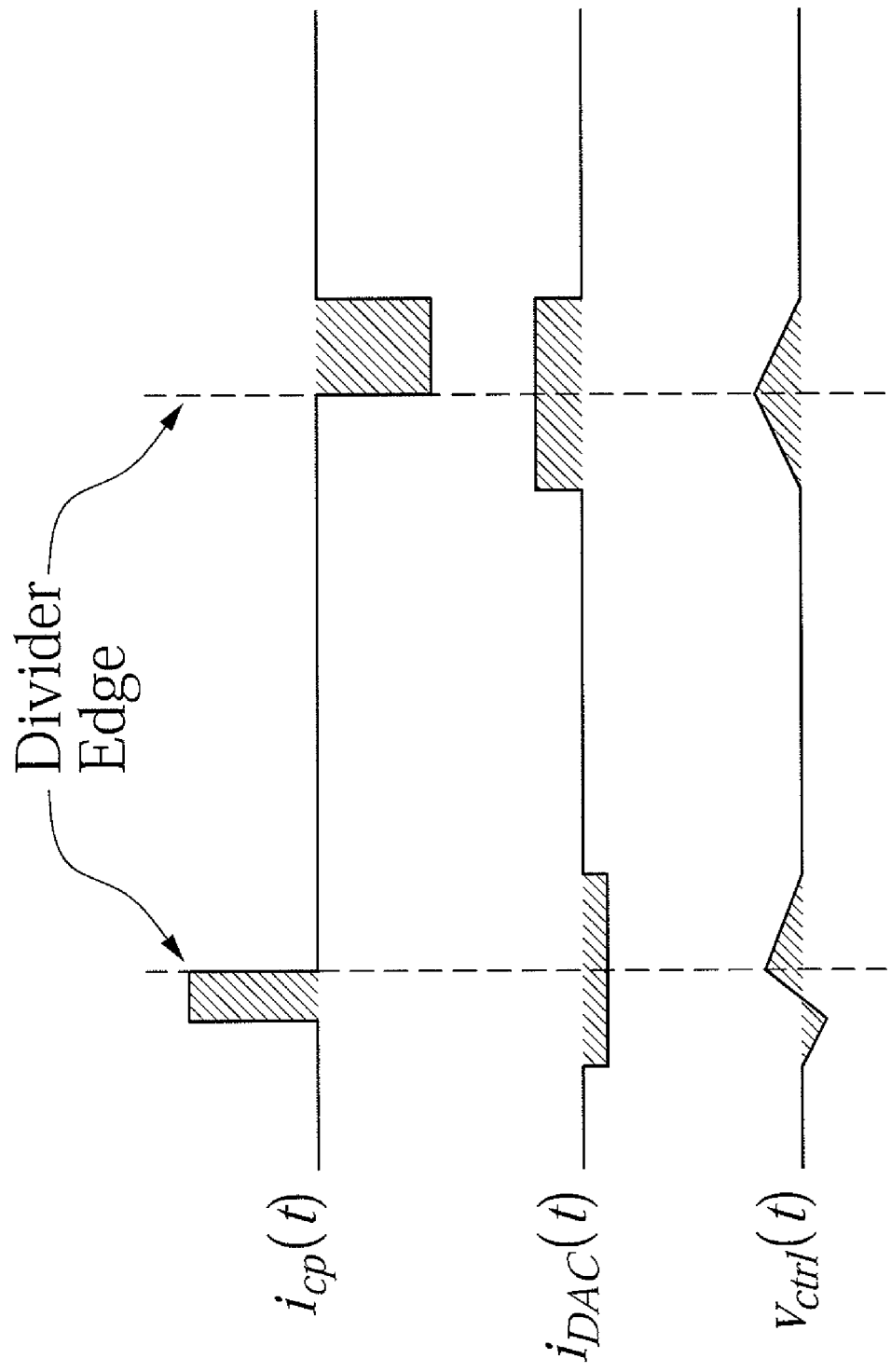
FIG. 3 is a signal diagram that illustrates the effect of cancelling pulse-width modulated charge pump pulses using pulse-amplitude modulated DAC pulses.
Figure 4A:
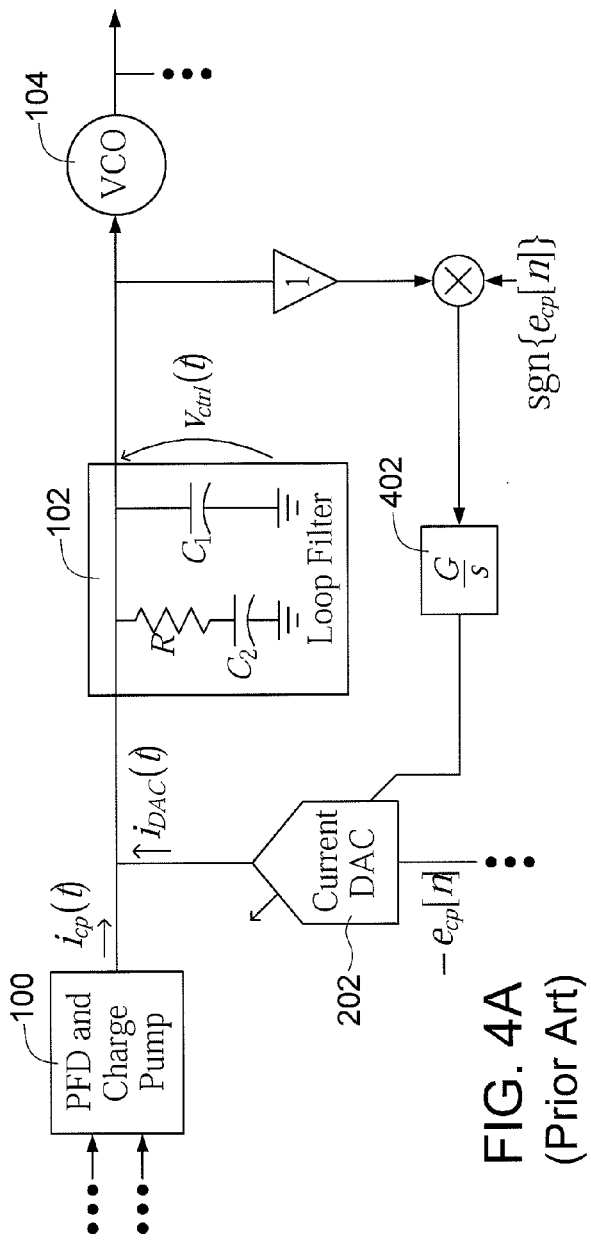
FIG. 4A (prior art) is a block diagram of a prior adaptive calibration technique and FIG. 4B (prior art) is the simulated discrete time power spectral density of the calibration signal $\text{sgn}\{e_{cp}[n]\}$ from FIG. 4A.
Figure 4B:
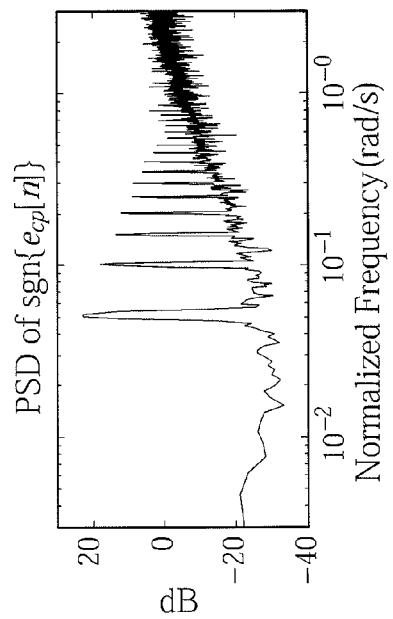

In the Specification:

| | |
|---|---|
| Col. 5, line 9 | Please delete "sgn{$e_{cp}$[n]}" and insert --sgn{ecp[n]}-- therefor. |
| Col. 5, line 14 | Please delete "sgn{$e_{cp}$[n]}" and insert --sgn{ecp[n]}-- therefor. |
| Col. 5, line 25 | Please delete "$\alpha f_{ref}$," and insert --αfref,-- therefor. |
| Col. 5, line 54 | Before "FIG. 1A", please delete "to". |
| Col. 5, line 65 | Please delete "sgn{$e_{cp}$[n]}" and insert --sgn{ecp[n]}-- therefor. |
| Col. 6, line 58 | Please delete "PILL" and insert --PLL-- therefor. |
| Col. 6, line 62 | After "greater", please delete "is". |
| Col. 7, line 36 | Please delete "sgn{$e_{cp}$[n]}" and insert --sgn{ecp[n]}-- therefor. |
| Col. 7, line 38 | Please delete "sgn{$e_{cp}$[n]}=1" and insert --sgn{ecp[n]}=1-- therefor. |
| Col. 7, line 39 | Please delete "sgn{$e_{cp}$[n]}=–1" and insert --sgn{ecp[n]}=–1-- therefor. |
| Col. 7, line 51 | Please delete "sgn{$e_{cp}$[n]}" and insert --sgn{ecp[n]}-- therefor. |
| Col. 7, lines 55-56 | Please delete "sgn{$e_{cp}$[n]}" and insert --sgn{ecp[n]}-- therefor. |
| Col. 7, line 59 | Please delete "sgn{$e_{cp}$[n]}" and insert --sgn{ecp[n]}-- therefor. |
| Col. 8, line 1 | Please delete "sgn{$e_{cp}$[n]}" and insert --sgn{ecp[n]}-- therefor. |
| Col. 8, line 1 | After "affect", please insert --on--. |
| Col. 8, line 44 | Please delete "$v_{div}$(t)" and insert --vdiv(t),-- therefor. |
| Col. 8, line 58 | Please delete "$v_{ctrl}$(t)" and insert --vctrl(t)-- therefor. |
| Col. 8, line 63 | Please delete "$v_{ctrl}$(t)" and insert --vctrl(t)-- therefor. |
| Col. 9, line 17 | Please delete "sgn{$e_{cp}$[n]}" and insert --sgn{ecp[n]}-- therefor. |
| Col. 9, line 50 | Please delete "$e_{cp}$[n]" and insert --ecp[n]-- therefor. |
| Col. 9, line 53 | Please delete "$e_{cp}$[n]" and insert --ecp[n]-- therefor. |